US00RE42291E

(19) United States
(12) Reissued Patent
Biman et al.

(10) Patent Number: US RE42,291 E
(45) Date of Reissued Patent: Apr. 12, 2011

(54) SYSTEM AND METHOD FOR PROCESSING DIGITAL VISUAL INTERFACE COMMUNICATION DATA SIGNALS AND DISPLAY DATA CHANNEL COMMUNICATION SIGNALS OVER A TRANSMISSION LINE

(75) Inventors: Aapoolcoyuz Biman, Thunder Bay (CA); Birubi Ram Biman, legal representative, Thunder Bay (CA); John Hudson, Burlington (CA); Eliyahu D. Zamir, Thornhill (CA); Stephen P. Webster, Oakville (CA)

(73) Assignee: Gennum Corporation (CA)

(21) Appl. No.: 12/478,032

(22) Filed: Jun. 4, 2009

Related U.S. Patent Documents

Reissue of:
(64) Patent No.: 7,230,989
Issued: Jun. 12, 2007
Appl. No.: 10/388,899
Filed: Mar. 14, 2003

U.S. Applications:
(60) Provisional application No. 60/364,430, filed on Mar. 15, 2002, and provisional application No. 60/441,010, filed on Jan. 17, 2003.

(51) Int. Cl.
*H04L 27/00* (2006.01)

(52) U.S. Cl. ..... 375/259; 318/678; 326/79; 326/100; 326/134; 327/52; 330/252; 333/18; 341/134; 379/340; 379/398

(58) Field of Classification Search ..... None
See application file for complete search history.

(56) References Cited

U.S. PATENT DOCUMENTS 4,110,685 A 8/1978 Leenerts
4,230,910 A 10/1980 Simokat (Continued)

FOREIGN PATENT DOCUMENTS

DE 3545263 12/1985
EP 0073400 8/1982

(Continued)

OTHER PUBLICATIONS

Baker, Alan J., "FA 10.7: An Adaptive Cable Equalizer for Serial Digital Video Rates to 400Mb/s", 1998 IEEE International Solid State Circuit Conference, 2 pages.

(Continued)

*Primary Examiner*—David C Payne
*Assistant Examiner*—Adolf Dsouza

(57) ABSTRACT

A digital communication system for transmitting and receiving Digital Visual Interface (DVI) communication data signals and Display Data Channel (DDC) communication signals over a transmission line comprises an open-loop equalizer circuit and a DDC extension circuit. The open-loop equalizer circuit is operable to receive DVI communication signals transmitted over the transmission line and output equalized DVI communication data signals. The DDC extension circuit is operable to inject a boost current at the receive end of the transmission line during a positive transition in the DDC communication signal, and clamp the receive end of the transmission line during a negative transition of the DDC communication signal.

33 Claims, 11 Drawing Sheets

U.S. PATENT DOCUMENTS

| | | | |
|---|---|---|---|
| 4,590,394 | A | 5/1986 | Pace |
| 4,658,440 | A | 4/1987 | Pavio et al. |
| 4,862,103 | A | 8/1989 | Funada |
| 4,943,739 | A | 7/1990 | Slaughter |
| 5,099,366 | A | 3/1992 | Ahlgrim |
| 5,119,365 | A | 6/1992 | Warner et al. |
| 5,253,249 | A | 10/1993 | Fitzgerald et al. |
| 5,300,893 | A | 4/1994 | Freuler et al. |
| 5,376,088 | A | 12/1994 | Glaros |
| 5,396,191 | A | 3/1995 | Sone |
| 5,426,389 | A | 6/1995 | Webster |
| 5,528,167 | A | 6/1996 | Samela et al. |
| 5,606,284 | A | 2/1997 | Tamesue et al. |
| 5,644,214 | A | 7/1997 | Lee |
| 5,761,251 | A | 6/1998 | Wender |
| 5,917,468 | A | 6/1999 | Han |
| 5,995,168 | A | 11/1999 | Yagi |
| 6,114,840 | A | 9/2000 | Farrell et al. |
| 6,204,654 | B1 | 3/2001 | Miranda et al. |
| 6,304,615 | B1 | 10/2001 | Webster |
| 6,489,838 | B1 | 12/2002 | Tsinker |
| 6,492,876 | B1 | 12/2002 | Kamal et al. |
| 2001/0036193 | A1 | 11/2001 | Kori |
| 2001/0052811 | A1 | 12/2001 | Kim |
| 2003/0043897 | A1 | 3/2003 | Papanikolaou et al. |

FOREIGN PATENT DOCUMENTS

| | | | |
|---|---|---|---|
| EP | 90313649.7 | | 7/1991 |
| EP | 0445057 | | 9/1991 |
| EP | 94300490.3 | | 8/1994 |
| EP | 1065850 | | 1/2001 |
| FR | 2-665-808 | | 8/1990 |
| TW | 427083 | * | 3/2001 |
| TW | 437218 | * | 5/2001 |

OTHER PUBLICATIONS

Chang, Luke et al., "Digital Visual Interface", Dell Computer Corporation, May 2000, Technology Brief, pp. 1–4.

DDWG, Digital Display Working Group, "Digital Visual Interface DVI", Revision 1.0, Apr. 2, 1999, 76 pages.

Gray, Paul R., et al., "Analysis and Design of Analog Integrated Circuits", University of California, Berkeley, John Wiley & Sons, 1984, 3 pages.

InFocus Corporation, "Digital Visual Interface (DVI)", White Paper, Nov. 2001, pp. 1–10.

Johns, David et al., "Analog Integrated Circuit Design", University of Toronto, John Wiley & Sons, 1997, 3 pages.

Maxim Integrated Products, "Maxim 3.2Gbps Adaptive Equalizer", Sunnyvale, California, 2001, pp. 1–10.

Shakiba Mohammad H., "WP 23.2 A 2.5Gb/s Adaptive Cable Equalizer", 1999 IEEE International Solid–State Circuits Conference, pp. 1–10.

Office Action (with U.S. translation) dated May 14, 2010 with Search Report issued by the Taiwan Patent Office in connection with Taiwan Application Serial No. 092105639 filed on Mar. 14, 2001, 6 pages.

* cited by examiner

SYSTEM AND METHOD FOR PROCESSING DIGITAL VISUAL INTERFACE COMMUNICATION DATA SIGNALS AND DISPLAY DATA CHANNEL COMMUNICATION SIGNALS OVER A TRANSMISSION LINE

Matter enclosed in heavy brackets [ ] appears in the original patent but forms no part of this reissue specification; matter printed in italics indicates the additions made by reissue.

This application claims the benefit of and priority to U.S. Provisional Application Ser. No. 60/364,430, entitled "Equalization In Digital Video Interfaces," and filed on Mar. 15, 2002, and U.S. Provisional Application Ser. No. 60/441,010, entitled "Systems And Methods For Data Communication And Transmission," and filed on Jan. 17, 2003. The entire disclosures of Application Ser. Nos. 60/364,430 and 60/441,010 are incorporated herein by reference.

This application is related to co-pending U.S. patent application Ser. No. 10/389,119, filed on Mar. 14, 2003, entitled "Input Follower System And Method," and is also related to co-pending U.S. patent application Ser. No. 10/388,916, filed on Mar. 14, 2003, entitled "Digital Communication Extender System And Method."

BACKGROUND

1. Technical Field

This application generally relates to digital communication systems and methods, and particularly relates to Digital Visual Interface (DVI) communications.

2. Description of the Related Art

The Digital Visual Interface (DVI) Specification, Revision 1.0, dated Apr. 2, 1999, and published by Digital Display Working Group, provides for a high speed digital connection for visual data types that is display technology independent. A DVI interface is typically focused on providing a connection between a computer and the computer display device. A DVI system uses a transition minimized differential signal (TMDS) for a base electrical connection, in which 8 bits of data are encoded into a 10-bit, transition minimized DC balanced character.

DVI accommodates several different serial signal rates, the highest of which is a signal rate of 1650 Mb/s. This signal rate corresponds to a data rate of 825 MHz. The DVI data may be transmitted over a video bus in a computer device, such as in laptop computer, or may be transmitted over a cable that is external to a computer device, such as a video cable used to connect a remote monitor to a computer. Typically, cables over short distances and low frequencies can be considered ideal channels having minimal loss and a bandwidth much greater than the input signal. The ideal cable with infinite bandwidth produces no dispersion of the input data.

Real cables, however, have a loss characteristic that is a function of the data frequency and the cable length. Thus, the longer the cable length, the greater the loss characteristic. In practical applications, the attenuation of the high frequency components of the DVI data signal at 1650 MHz typically limits DVI cable lengths to about 5 meters.

Equalizers may be used to restore the integrity of the DVI data so that the cable length between the source and the destination does not reduce the system performance. Many equalizers comprise a differential pair having an automatic gain control (AGC) feedback block between the output of the differential pair and the inputs of the differential pair. Additionally, many of these differential pairs utilize inductors, which demand a relatively large amount of semiconductor area and are susceptible to noise.

The DVI specification also supports the VESA Display Data Channel (DDC), which enables the computer display, the computer, and a graphics adapter to communicate and automatically configure the system to support different features available in the computer display. The DDC link is typically a lower bandwidth signal, e.g., 400 kHz, and thus may be transmitted over a longer cable length than the DVI data signal. However, the DDC cable is typically not terminated in an impedance match, and thus reflections in the DDC cable may degrade the DDC signal as the DDC cable length increases. Additionally, the bandwidth of the DDC signal is limited by the amount of pull-up current injected into the DDC cable during a transition of the data signal from a low voltage level to a high voltage level.

SUMMARY

A digital communication system for transmitting and receiving Digital Visual Interface (DVI) communication data signals and Display Data Chemical (DDC) communication signals over a transmission line comprises an open-loop equalizer circuit and a DDC extension circuit. The open-loop equalizer circuit is operable to receive DVI communication signals transmitted over the transmission line and output equalized DVI communication data signals. The DDC extension circuit is operable to inject a boost current at the receive end of the transmission line during a positive transition in the DDC communication signal, and clamp the receive end of the transmission line during a negative transition of the DDC communication signal.

DETAILED DESCRIPTION

Figure 1:
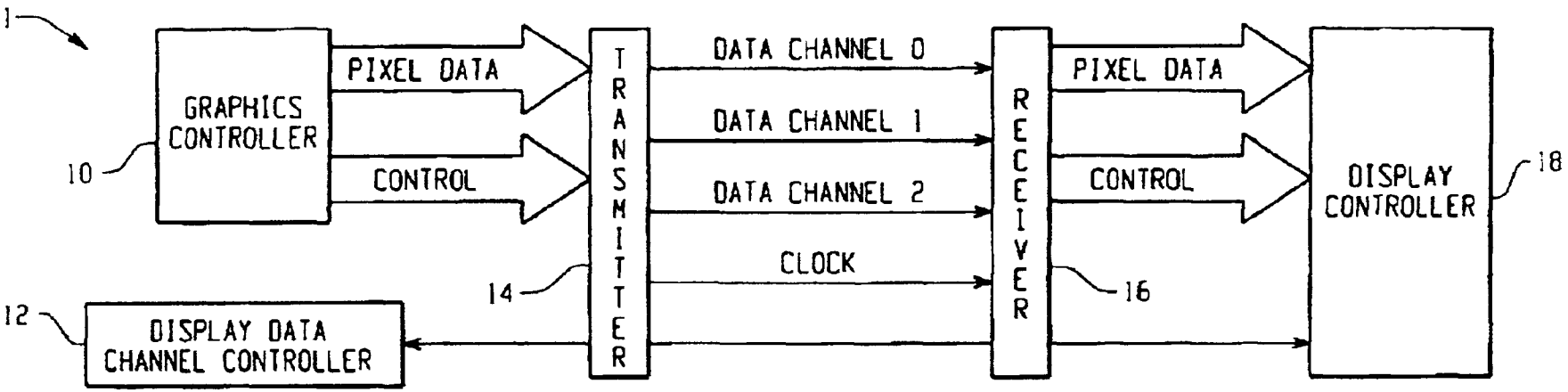
FIG. 1 is a block diagram of a DVI communication system.

FIG. 1 is a block diagram of a DVI communication system 1, which includes a graphics controller 10, a DDC controller 12, a transmitter 14, a receiver 16, and a display controller 18. A DVI data line typically comprises three data channels, shown as Data Channels 0, 1 and 2, and a clock.

The graphics controller 10 is operable to encode 8 bits of video data into a 10-bit TMDS DC balanced character on each data channel. The graphics controller 10 may be one of many DVI-compliant graphics controllers. The transmitter 14 and receiver 16 are operable to transmit and receive the 10-bit TMDS DC balanced characters over a transmission line. The display controller 18 is operable to decode the 10-bit character back into the 8 bits of video data for each data channel. The display controller 18 may be one of many DVI-compliant display controllers.

The DDC controller 12 is operable to transmit DDC data and receive DDC data over the transmission line. Unlike the DVI data, the DDC data is not DC balanced. The DDC data link typically comprises a clock channel and a digital data channel.

Usually, the physical path between the transmitter 14 and the receiver 16 is less than five meters. For example, the transmitter 14 and receiver 16 may be enclosed in a single enclosure, such as when connected by a short video bus within a laptop computer. Alternatively, the receiver 16 may be connected to the transmitter 14 by a relatively short cable. Because the cable impedance, signal attenuation, and reflection are proportional to the cable length, signal degradation does not typically affect data integrity for relatively short cables.

Table 1 below provides the maximum allowable attenuation for a transmitted DVI signal.

TABLE 1

| Maximum Attenuation | |
|---|---|
| Data Frequency (MHz) | Maximum Attenuation (dB) |
| 1 | 0.14 |
| 10 | 0.45 |
| 50 | 1.0 |
| 100 | 1.5 |
| 200 | 2.1 |
| 400 | 3.0 |
| 700 | 4.3 |
| 1000 | 5.4 |

From Table 1, it can be seen that the maximum attenuation for a data frequency rate of 825 MHz is approximately 5 dB, which corresponds to a maximum cable length of about 5 meter. Accordingly, to transmit DVI data over a cable in excess of 5 meters, equalization of the DVI data is usually required. Additionally, as the cable length increases, signals on the DDC data channel begin to degrade due to reflections and decreased rise times. Thus, a DDC extender circuit may be used in conjunction with an equalizer.

Figure 2:
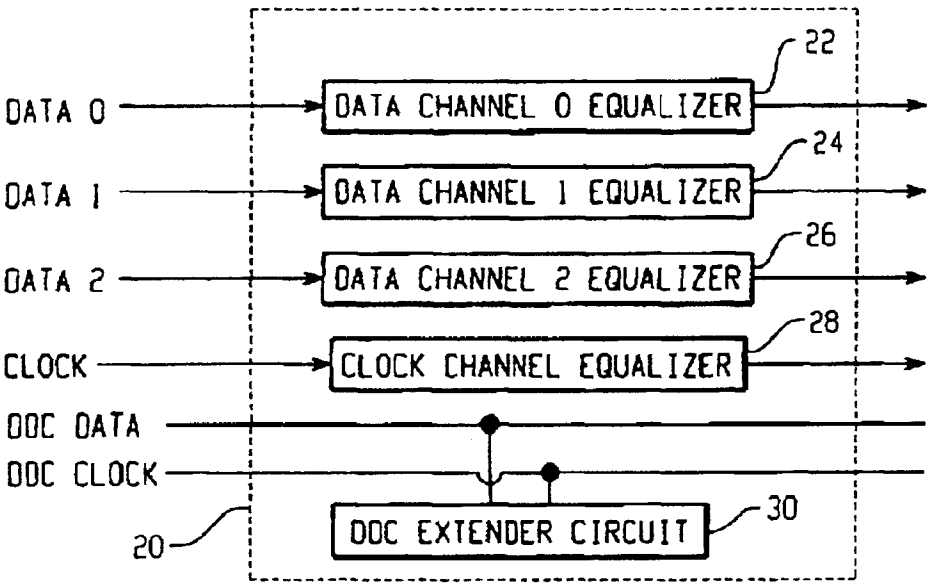
FIG. 2 is a block diagram of a digital communication system comprising equalizers and a DDC extender circuit.

FIG. 2 is a block diagram of a digital communication system 20 comprising four equalizers 22, 24, 26, and 28 and a DDC extender circuit 30. The four equalizers 22, 24, 26, and 28 each correspond to one of the data channels 0, 1, 2, and the clock channel. While each of these equalizers 22, 24, 26 and 28 may accommodate different data rates, the equalizer 22, 24, and 26 are typically matched equalizers as the data rate over each data channel is the same. The equalizer 28 may be configured to accommodate a data rate different than that of the equalizers 22, 24 and 26, as the clock rate may be different than the data rate of the data channels 0, 1 and 2.

Each of the equalizers 22, 24, 26 and 28 comprise an open-loop architecture in which the output signal of the equalizer is not fed back to adjust the input signal to the equalizer, and are configured to receive a DC balanced differential signal as the input signal.

The DDC channel comprises a DDC data channel and DDC clock channel, and the DDC extender circuit 30 comprises circuitry serving both of these channels. Because the DDC channel is typically a lower frequency channel as compared to the DVI data channels, the DDC channel does not incorporate an equalizer circuit. The DDC extender circuit 30 is located on a receiving end of a transmission line and provides voltage clamping during data transition from a positive voltage data signal to a zero voltage data signal, and also provides a boost current during data transition from a zero voltage data signal to a positive voltage data signal.

The digital communication system 20 may be located on the side of the transmitter 14, or on the side of the receiver 16, or on both the side of the transmitter 14 and the receiver 16. Typically, the DDC extender circuit 30 is located on the receive end of the transmission line. Additionally, the DDC extender circuit 30 may be located on both ends of the transmission line if the transmission line is used for bi-directional communication. The DDC extender circuit 30 need not be located on both ends of the transmission line for bi-directional communication, however. For example, the DDC extender circuit 30 may be located at the receiver 16, and the transmitter 14 may have different reflection and impedance mitigation circuitry, or none at all.

Figure 3:
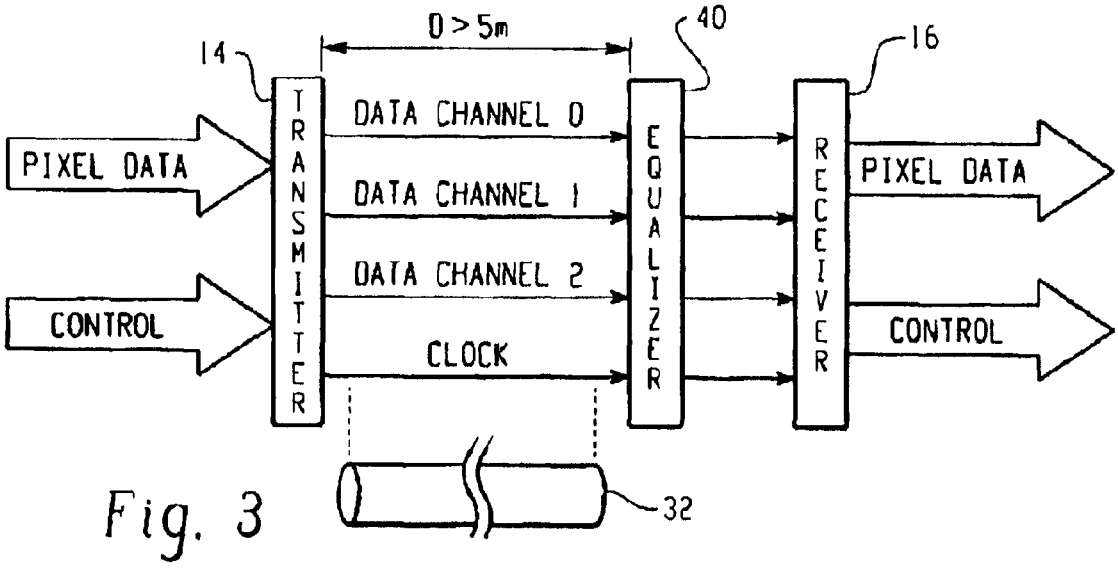
FIG. 3 is a block diagram of an equalizer configured to equalize data signals received at a receive end of a transmission line.
Figure 4:
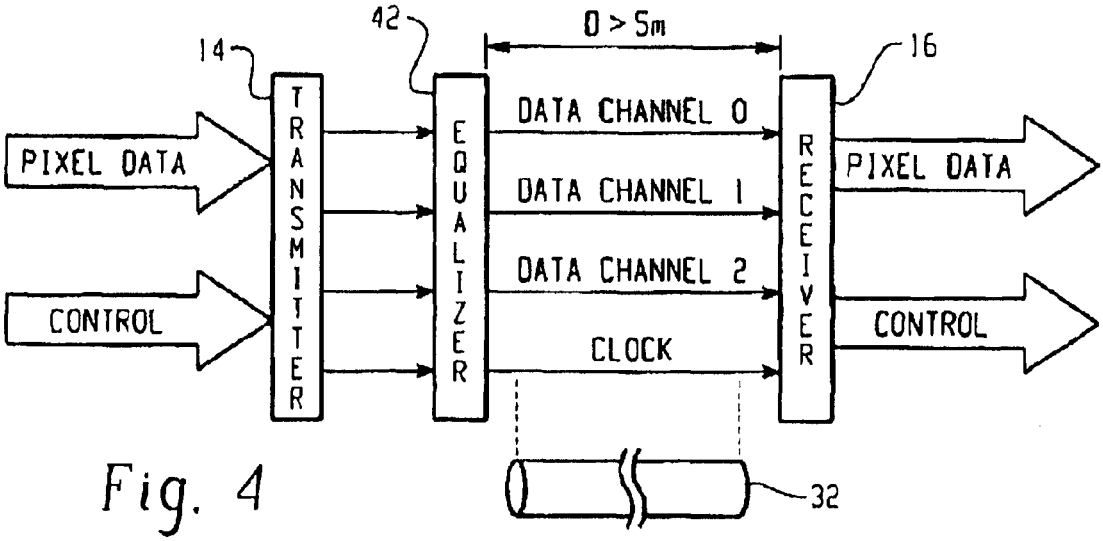
FIG. 4 is a block diagram of an equalizer configured to pre-emphasize data signals to be transmitted on the transmission line.
Figure 5:
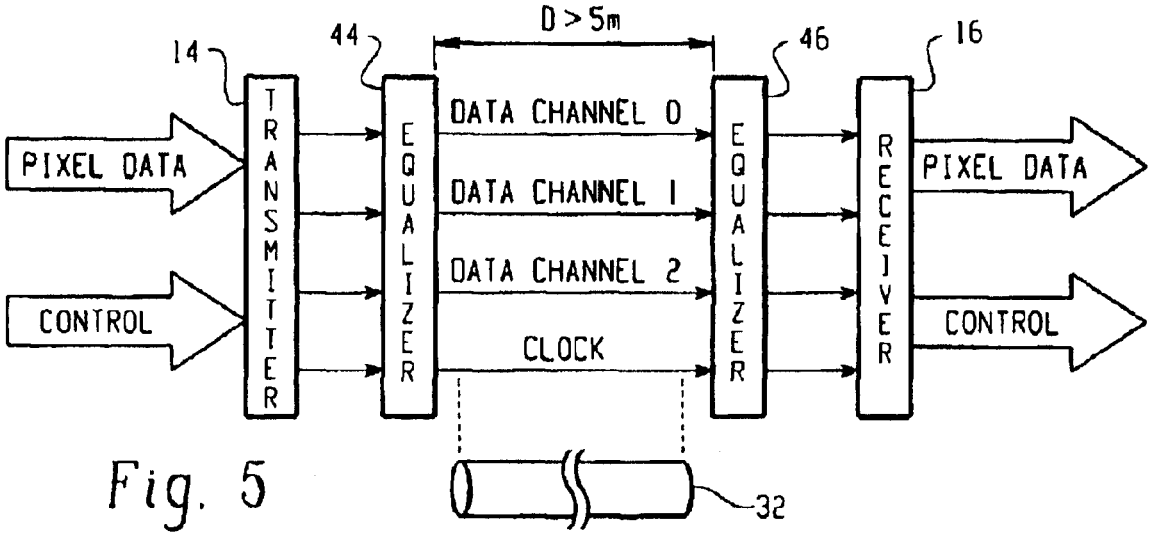
FIG. 5 is a block diagram of a pair of equalizers, the first equalizer configured to pre-emphasize data signals to be transmitted on the transmission line, and the second equalizer configured to equalize data signals received at a receive end of the transmission line.

The equalizers 22, 24, 26 and 28 may be located on the receive end of the transmission line before the receiver 16, or on the transmitting side of the transmission line after the transmitter 14, or on both the receive end of the transmission line before the receiver 16 and on the transmitting side of the transmission line after the transmitter 14. FIGS. 3–5 show several equalizer configurations. Because the positioning of the DDC extender circuit 30 has already been discussed, reference to the DDC extender circuit 30 is omitted from FIGS. 3–5.

FIG. 3 is a block diagram of an equalizer 40 configured to equalize data signals received at a receive end of a transmission line 32. The equalizer 40 may comprise equalizers 22, 24, 26 and 28, as described with reference to FIG. 2 above. In this embodiment, the equalizer 40 is configured to compensate for attenuation and dispersion of the DVI data signal received at the receive end of a transmission line 32.

In one variation of this embodiment, the equalizer 40 is configured to compensate for the length of the transmission line 32. For example, the equalizer 40 may be implemented in a remote monitor having a 20-meter video cable 32. The equalizer 40 may then be adjusted to compensate for frequency dependent attenuation corresponding to a 20-meter long video cable.

In another variation of this embodiment, the equalizer 40 may be adjusted to compensate for a maximum length D of the video cable 32. For example, the equalizer 40 may be implemented in a remote monitor having a receptacle for receiving a video cable, and the equalizer 40 is adjusted to compensate for a video cable 32 length of 30 meters. The remote monitor may thus be "rated" for a maximum video cable length of 30 meters.

In yet another variation of this embodiment, the equalizer 40 may be configured to compensate for frequency dependent attenuation caused by electrostatic discharge (ESD) protection circuitry located at the input of the receiver 16. An exemplary ESD protection circuit comprises a pair of diodes connected to a ground potential and a high potential, with an output pin or receptacle corresponding to a conductor of the transmission line 32 interposed between the diodes. The diodes tend to act as low pass filters due to their inherent capacitances, and thus attenuate the high frequency components of a data signal. Accordingly, the equalizer 40 is configured to compensate for the diode capacitances such that the output signal of the equalizer 40 includes restored high frequency components of the original data signal.

FIG. 4 is a block diagram of an equalizer 42 configured to pre-emphasize data signals to be transmitted on the transmission line 32. The equalizer 42 may comprise equalizers 22, 24, 26 and 28, as described with respect to FIG. 2. For example, the equalizer 42 may be implemented in a computer device for generating video signals and having a 20-meter video cable 32. The equalizer 42 may then be adjusted to compensate for frequency dependent attenuation corresponding to a 20-meter long video cable.

In another variation of this embodiment, the equalizer 42 may be adjusted to compensate for a maximum length D of the video cable 32. For example, the equalizer 42 may be implemented in a computer device for generating video signals and having a receptacle for receiving a video cable, and the equalizer 42 is adjusted to compensate for a video cable 32 length of 30 meters. The computer device may thus be "rated" for a maximum video cable length of 30 meters.

In yet another variation of this embodiment, the equalizer 42 may be configured to compensate for frequency dependent attenuation caused by ESD protection circuitry located at the output of the transmitter 14. The equalizer 42 is configured to compensate for the ESD protection circuitry such that the output signal of the equalizer 42 includes restored high frequency components of the original data signal.

FIG. 5 is a block diagram of a pair of equalizers 44 and 46, the first equalizer 44 configured to pre-emphasize data signals to be transmitted on the transmission line 32, and the second equalizer 46 configured equalize data signals received at a receive end the transmission line 32. The equalizer 44 and 46 may be configured in a similar manner as the equalizers 42 and 40, as described with reference to FIGS. 3 and 4 above.

Figure 6A:
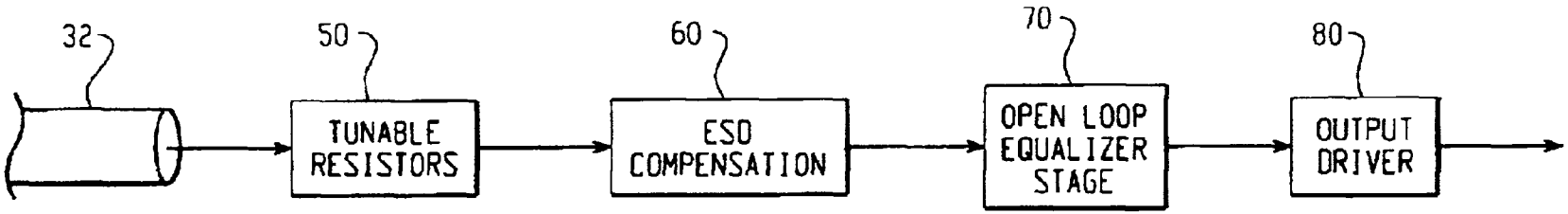
FIG. 6A is a block diagram of a receive side of the system of FIG. 3.

FIG. 6A is a block diagram of the system of FIG. 3. The system includes tunable resistors 50, an ESD compensation circuit 60, an open-loop equalizer stage 70, and an output driver 80. A DVI data channel typically implements a current mode output driver to generate a differential current data signal that is transmitted over the transmission line 32. The open-loop equalizer stage 70, however, is configured to receive a differential voltage signal as an input signal. Accordingly, the tunable resistors 50 are matched to the impedance of the transmission line 32 and convert the differential current data signal to a corresponding differential voltage data signal.

The ESD compensation circuit 60 is configured to compensate for the high frequency attenuation of the data signal in a manner as described above with reference to FIG. 3, and die open-loop equalizer stage 70 is configured to compensate for frequency dependent attenuation in the data signal caused by the characteristic impedance of the transmission line 32. Typically, the ESD compensation circuit 60 may comprise an open-loop equalizer stage similar to the open-loop equalizer stage 70. Accordingly, in a variation of the embodiment of FIG. 6A, the ESD compensation circuit may be combined with the open-loop equalizer stage 70.

The output driver 80 is configured to receive the equalized data signal from the open-loop equalizer 70 and provide the equalized data signal to processing circuitry, such as the display controller 18 of FIG. 1. The output driver 80 may be a buffer circuit, or may be a converter circuit operable to convert the output differential voltage of the open-loop equalizer stage 70 into a differential current signal. The converter circuit may be utilized as an output driver 80 in the case of a DVI repeater stage, for example.

Figure 6B:
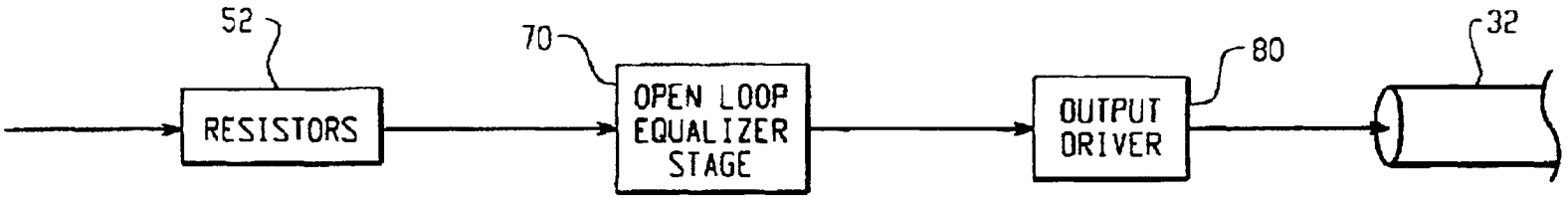
FIG. 6B is a block diagram of a transmit side of the system of FIG. 4.

FIG. 6B is a block diagram of a transmit side of the system of FIG. 4. The system includes resistors 52, an open-loop equalizer stage 70, and an output driver 80. Because a DVI data channel implements a current mode output driver to generate a differential current data signal that is transmitted over the transmission line 32, the resistors 52 are used to covert the current data signal into a corresponding differential voltage data signal. The open-loop equalizer stage 70 is configured to provide pre-emphasis for frequency dependent attenuation in the data signal caused by the characteristic impedance of the transmission line 32 in a manner such as described with reference to FIG. 4 above. The output driver 80 is configured to convert the pre-emphasized differential voltage data signal into a corresponding differential current data signal for transmission over the transmission line 32.

While the embodiments of FIGS. 2–6B have been described with reference to a DVI application, the ESD compensation circuit 60 and the open-loop equalizer stage 70 may also be implemented in other systems designed to transmit and receive DC balanced data signals. The DC balanced data signals may be either differential current data signals, as in the case of DVI data signals, or may be differential voltage data signals, as in the case of other DC balanced data signals.

Figure 7:
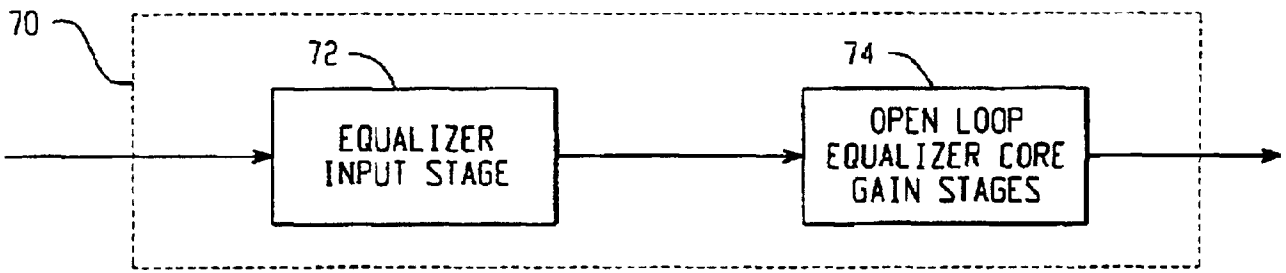
FIG. 7 is a block diagram of an open-loop equalizer stage utilized in the systems of FIGS. 3–6B.

FIG. 7 is a block diagram of an open-loop equalizer stage 70 utilized in the systems of FIGS. 3–6B. The open-loop equalizer stage 70 comprises an equalizer input stage 72 and at least one open-loop equalizer core gain stage 74. The equalizer input stage 72 is configured to receive a differential input voltage signal and condition the differential input voltage signal for input into the open-loop equalizer core gain stages 74. The conditioning may be an adjustment of the differential voltage input signal to a DC bias point, for example. The differential signal is DC balanced and symmetric about a DC bias point.

A DC balanced data signal is a data signal comprising DC characters having an average DC value. For example, a data signal may be divided into 6-bit characters, and the DC value of each 6-bit character may be 2 volts (for a voltage signal) or 50 milliamps (for a current signal). In the case of DVI graphics data, a graphics controller, such as the graphics controller 10 of FIG. 1, is operable to encode 8 bits of video data into a 10-bit TMDS DC balanced character on each data channel. One exemplary method of creating DC balanced data signals is described in the Digital Visual Interface Specification, Revision 1.0, dated Apr. 2, 1999, and published by Digital Display Working Group, the disclosure of which is incorporated herein by reference.

The open-loop equalizer core gain stages 74 are configured to receive the output of the equalizer input stage 70 and equalize the voltage data signal by conditioning the signal through one or more of the equalizer circuits described with reference to FIGS. 10 and 11 below. The open-loop equalizer core gain stages 74 comprise an open-loop architecture in which the output signal of the equalizer is not fed back to adjust the input signal to the equalizer. Additionally, the open-loop equalizer core gain stages 74 need not utilize an automatic gain control (AGC) circuit. Rather, the open-loop equalizer core gain stages 74 utilize an input follower stage to provide adaptive equalization of the differential data signal.

Figure 8:
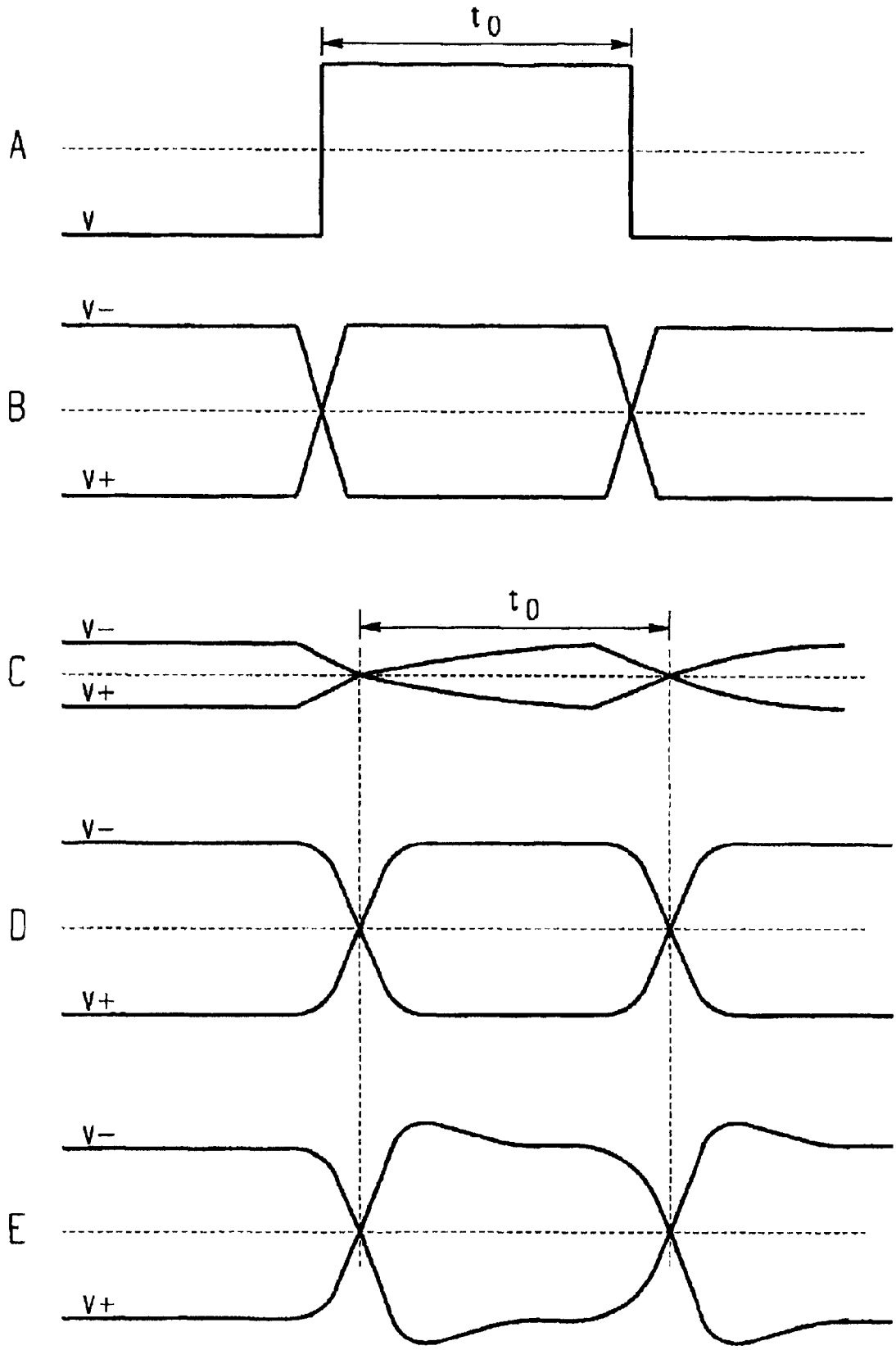
FIG. 8 is a timing diagram of one DC pulse in a DC balanced data signal and a corresponding differential signal transmitted over the transmission line and equalized by the open-loop equalizer stage of FIG. 7.

FIG. 8 is a timing diagram of one DC pulse in a DC balanced data signal and a corresponding differential signal transmitted over the transmission line and equalized by the open-loop equalizer stage 70 of FIG. 7. The DC pulse may be either a current data signal or a voltage data signal, depending on the particular communication protocol implemented.

Axis A depicts an ideal data pulse with zero rise and fall time and a period of $t_0$, and axis B depicts a corresponding differential data signal. The differential signal of axis B is symmetric about the B axis that represents a DC value, and is transmitted over a transmission line. The differential signal of axis C depicts a received pulse corresponding to the differential signal of axis B received at the received end of the transmission line.

The received pulse of axis C illustrates the frequency dependent attenuation of the high frequency components of the differential signal of axis B as the signal propagates over the transmission line. As can be seen by inspection of the data signal of axis C, the transmission line low pass filters the differential signal of axis B. Because the data signal is DC balanced, however, crossing points over the DC value define the time period $t_0$, which corresponds to the time period of the ideal pulse of axis A.

The open-loop equalizer stage 70 is configured to receive the differential signal of axis C as input, compensate for the frequency dependent attenuation of the transmission line, and output an equalized differential data signal. Depending on the length of the transmission line and the gain of the open-loop equalizer stage 70, the received differential signal may undergo proportional equalization or disproportionate equalization. Axes D and E illustrate equalized data pulses for the case of proportional equalization and disproportionate equalization, respectively. The data signal of axis D has been proportionally equalized, i.e., the open-loop equalizer stage 70 has provided a frequency dependent gain that is nearly the inverse of the frequency dependent attenuation caused by the transmission line.

The data signal of axis E, however, has undergone disproportionate equalization, i.e., the open-loop equalizer stage 70 has provided a frequency dependent gain that results in gain that is greater than the inverse of the frequency dependent attenuation caused by the transmission line. Accordingly, the differential data signal of axis E has a noticeable ripple due to the disproportionate magnitude of the high frequency components. Because the data signal is DC balanced, however, the crossing points over the DC value define the time period $t_0$, which corresponds to the time period of the ideal pulse of axis A. The open-loop equalizer core gain stage 74, therefore, does not require an AGC circuit to adjust the output level of the equalized data signal. Additionally, a monitor or similar receiving device utilizing an open-loop equalizer stage 70 configured to provide equalization up to a maximum cable length, e.g., 30 meters, may thus be used with cables having cable lengths that are less than the maximum cable length.

As previously described, the open-loop equalizer core stage 74 provides a frequency dependent gain that is the inverse of the transmission loss due to the frequency dependent attenuation caused by the transmission line. The two primary loss mechanisms in a transmission line are skin effect and dielectric losses. These loss mechanisms may be expressed as the following transfer function:

$$G(f)=e^{-L(k_s\sqrt{jf}+k_d jf)} \tag{1}$$

where f is the frequency, $j=\sqrt{-1}$, L is the length of the transmission line, and $k_s$ and $k_d$ are the skin and the dielectric loss constants, respectively. These losses introduce both magnitude and, to a lesser extent, group delay distortions in data signals transmitted over the transmission line 22. Generally, the skin effect dominates the low frequency losses, while the dielectric loss dominates the high frequency losses.

An inverse function of G to compensate for these losses can be realized by expressing 1/G(f) as:

$$\frac{1}{G(f)} = e^{+L(k_s\sqrt{if}+k_d|f|)} = 1 + \alpha H(f) \tag{2}$$

where α is a factor proportional to the length of the cable. This inverse gain function is implemented in the open-loop equalizer core stages 74. A typical implementation may use several open-loop equalizer core stages 74 in cascade to obtain the required gain for a certain maximum loss, e.g., the maximum attenuation depending on the length of the transmission line. Ideally, the equalized signal at the output of the open-loop equalizer core stages 74 will match the originally transmitted data signal exactly if the transfer function H(f) can be replicated exactly.

Figure 9:
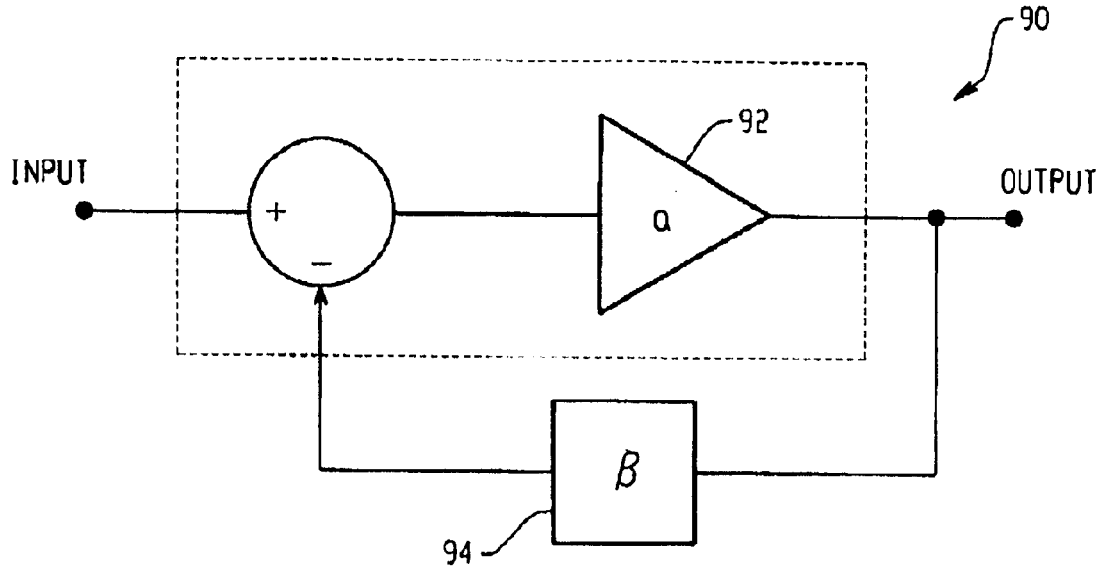
FIG. 9 is a block diagram of an input follower stage implemented at the input open-loop equalizer stage of FIG. 7.

FIG. 9 is a block diagram of an input follower stage 90 implemented at the input stage of the open-loop equalizer core gain stage 74 of FIG. 7. The input follower circuit 90 comprises an amplifier 90 and a feedback block 94 having a gain β. The closed-loop output impedance of the feedback topology shown in FIG. 13 may be expressed as:

$$Z_o = \frac{R_o}{1+\alpha\beta} \tag{3}$$

where $R_o$ is the open-loop output impedance, α is the open-loop gain and β is the feedback gain. In one embodiment, with β=1, the open-loop gain may be approximated by $$a = \frac{A_{dc}}{1+\frac{j\omega}{\omega_{p1}}} \tag{4}$$

where $A_{dc}$ is the dc gain of the amplifier 92, $\omega_{p1}$ is the dominant pole frequency of the amplifier 92 in radians per second, ω is the frequency in radians per second and $j-\sqrt{=1}$. Substituting equation (4) into equation (3) with β=1, and assuming $A_{dc}$ and ω are much smaller than dominant pole $\omega_{p1}$, equation (3) simplifies to:

$$Z_o \approx \frac{R_o}{\omega_{p1}} + \frac{R_o}{(\omega_{p1})^2} j\omega \tag{5}$$

The closed-loop output impedance of the feedback loop may be approximated by a resistance, represented by the first term $$\frac{R_o}{\omega_{p1}},$$

in series with an inductance, represented by the second term $$\frac{R_o}{(\omega_{p1})^2} j\omega.$$

Figure 10:
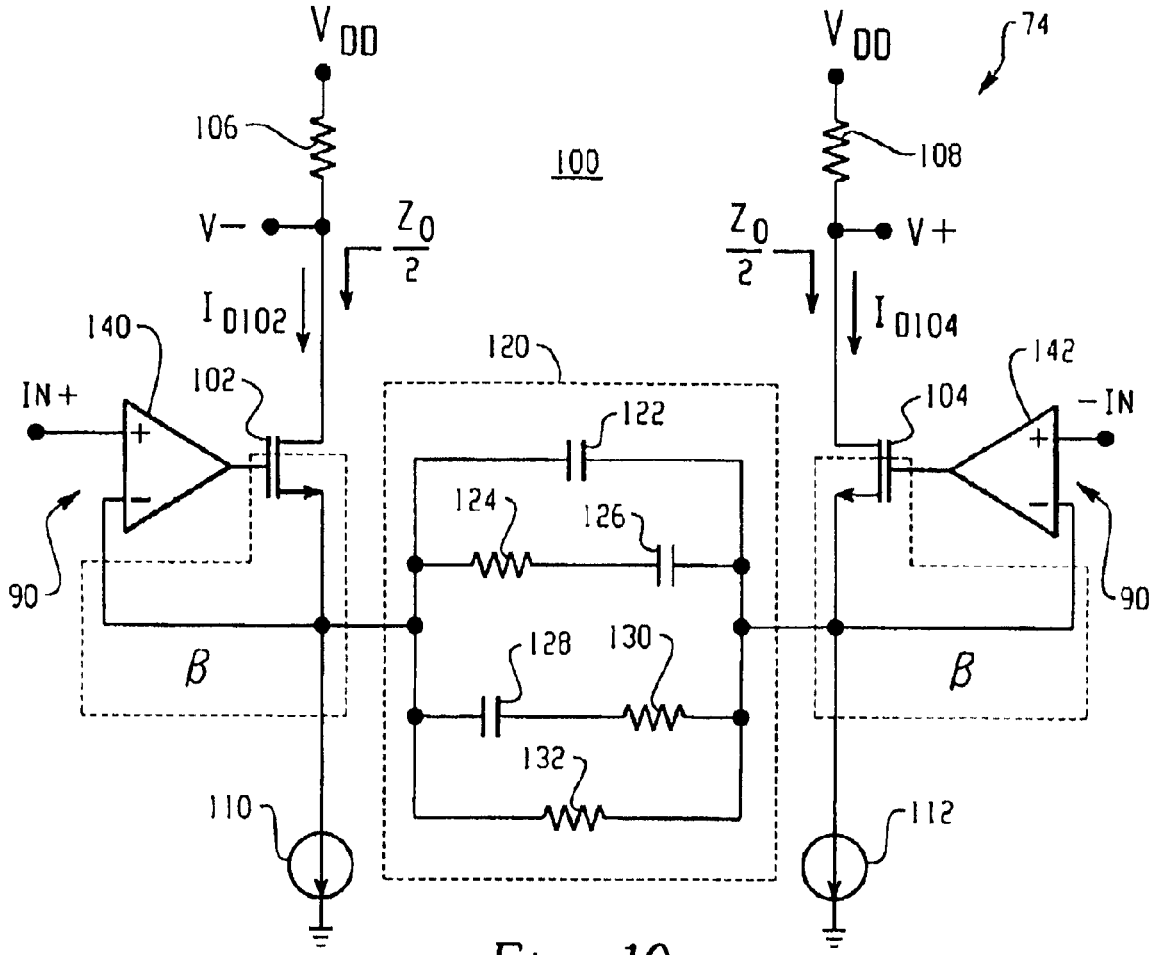
FIG. 10 is a circuit diagram on an embodiment of the open-loop equalizer of FIG. 7.

FIG. 10 is a circuit diagram on an embodiment of the open-loop equalizer 74 of FIG. 7 utilizing the input follower stage 90 of FIG. 9. The open-loop equalizer core stage 74 comprises a differential pair 100 that includes transistors 102 and 104, load resistors 106 and 108, and current sinks 110 and 112.

While the transistors 102 and 104 are shown as field effect transistors, other types of transistors may also be used. A reactive load 120 comprising capacitors 122, 126, and 128 and resistors 124, 130 and 132 is coupled to the differential pair 100 at the sources of the transistors 102 and 104. Typically, without the input follower stages 90, inductors are usually added at the drains of the transistors 102 and 104 to adjust the response of the differential pair to match transfer function H(f). Such inductors are typically large in size, requiring additional cost for silicon area. Also, the large spiral structure of a physical inductor may introduce unwanted noise to the circuit. However, as illustrated by the derivation of equation (5), the input follower stages 90 eliminate the need for such an inductor.

The input follower stages 90 are realized by a pair of amplifiers 140 and 142 configured to receive a differential voltage data signal corresponding to the DVI communication data signals as input and compare data signals received to a feedback signal from the reactive load 120. Based on this comparison, the amplifiers 140 and 142 generate corresponding first and second input signals for the transistors 102 and 104, respectively. In one embodiment, feedback is a unity game feedback signal, i.e., β=1. The open-loop equalizer core stages 74 of FIG. 10 utilize a practical implementation of input follower stages 90 with β≈1.

In another embodiment, β may be a value other than unity, or may be a frequency dependent variable. For example, β may be an adaptive feedback variable.

In operation, the transistors 102 and 104 are operated in the linear region. The capacitors 122, 136 and 128 are selected so that the high frequency gain of the differential pair 100 will approximate the transfer function H(f). The amplifiers 140 and 142 generate corresponding first and second input signals for the transistors 102 and 104. In response to the first and second input signals, the transistors adjust the corresponding drain currents $I_{D102}$ and $I_{D104}$, respectively, which in turn induce a voltage drop across resistors 106 and 108 to generate the equalized differential output signals V− and V+. Accordingly, the differential pair 100 operates in an open-loop configuration with respect to the output data signals V− and V+ generated at the resistors 106 and 108.

Thus, by selecting the particular values of the resistors and capacitors of the reactive load 120, and by cascading multiple open-loop equalizer core stages 74 such that the output of one of the open-loop equalizer core stages 74 is connected to the input of another of the open-loop equalizer core stages 74, the inverse gain function 1/G(f) of equation (2) may be readily realized.

Figure 11:
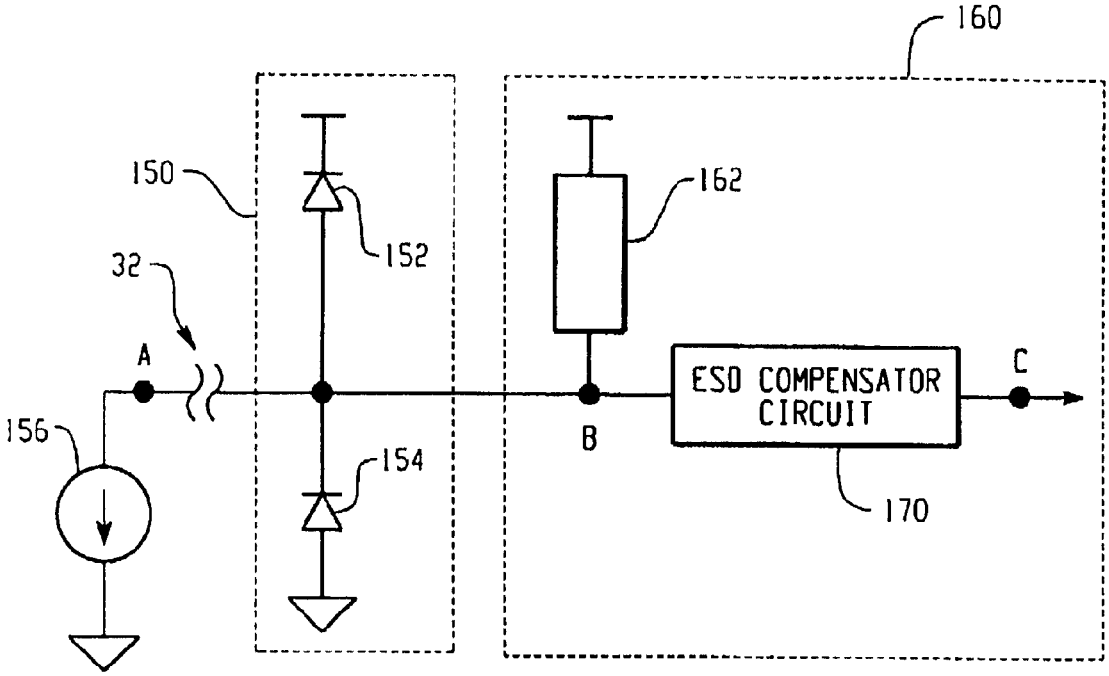
FIG. 11 is a block diagram of an electrostatic discharge (ESD) compensation circuit utilizing the open-loop equalizer stage of FIG. 7.

FIG. 11 is a block diagram of an ESD compensation circuit 170 utilizing the open-loop equalizer core gain stage 74 of FIG. 10. One conductor of a differential signal channel is shown in FIG. 11. The open-loop equalizer core stage 74 may be configured to compensate for frequency dependent attenuation caused by ESD protection circuitry located at the input of the receiver 16. The exemplary ESD protection circuit 150 comprises a pair of diodes 152 and 154 connected to a high potential and a ground potential, respectively, with an output pin or receptacle corresponding to the conductor of the transmission line 32 interposed between the diodes. A differential current sink 156 represents one of a pair of differential signals. The differential current sink 156 generates a differential voltage by inducing a voltage drop across a tunable resistor 162.

Figure 12:
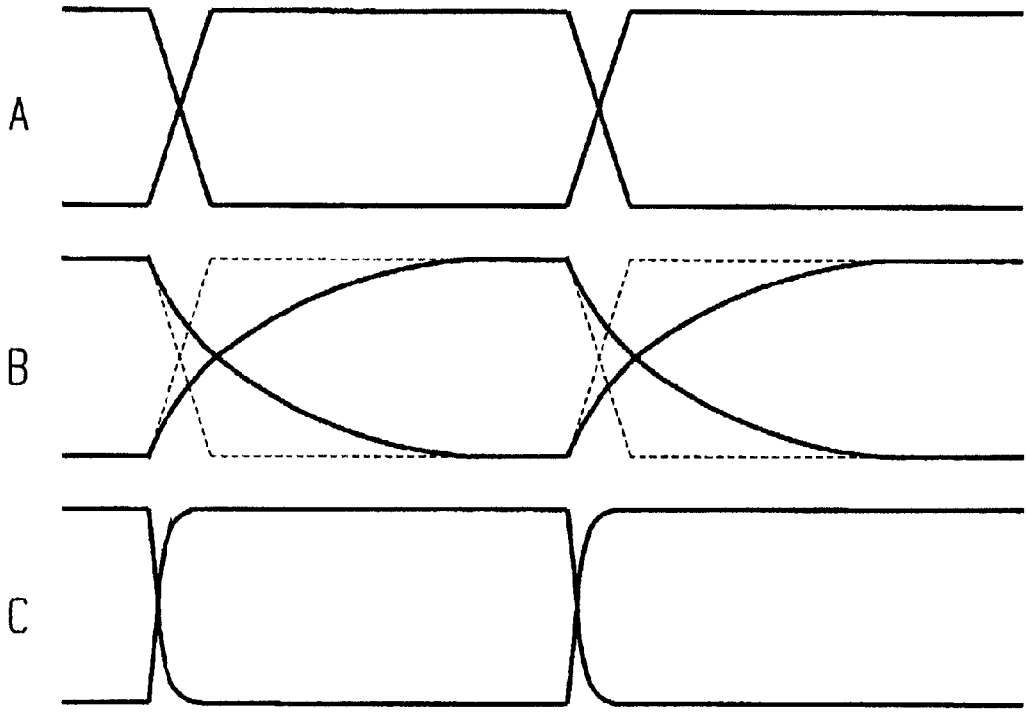
FIG. 12 is a timing diagram of a data signal passing through the ESD compensation circuit of FIG. 12.

FIG. 12 is a timing diagram of a data signal at several points in the circuit of FIG. 11. The differential signal A depicts the differential current signal at point A in the circuit of FIG. 11, and the differential signal B depicts the differential voltage signal generated at point B in the circuit of FIG. 11. The diodes 152 and 154 tend to act as low pass filters due to their inherent capacitances, and thus attenuate the high frequency components of the differential signal at point B. Accordingly, the ESD compensator circuit 170 is configured to compensate for the diode capacitances such that the output signal at point C includes substantially restored high frequency components of the original current data signal observed at point A.

The compensation is realized by configuring the reactive load 120 of the open-loop equalizer core gain stage 74 of FIG. 10 to provide an inverse gain of the low pass filter effect of the ESD protection circuit 150. For example, if the diodes 152 and 154 are modeled as single pole low pass filters having a filter response G(f), then the reactive load 120 is configured to provide the inverse gain function 1/G(f).

The open-loop equalizer core gain stages 74 may also be used to compensate for any intermediate circuitry between the transmitter 14 and the receiver 16; the ESD protection circuit 150 is but one example of such intermediate circuitry. Other intermediate circuitry may also include signal repeaters, transmission line taps, and the like.

FIGS. 3–12 depict various embodiments of a system for facilitating the transmission and reception of DC balanced differential data signals, and with particular illustrative emphasis on DVI data signals. The DVI specification also supports the VESA Display Data Channel (DDC), which enables the computer display, the computer, and a graphics adapter to communicate and automatically configure the system to support different features available in the computer display. The DDC link is typically a lower bandwidth signal, e.g., 400 kHz, and thus may be transmitted over a longer cable length than the DVI data signal. Accordingly, equalization of the DDC data and clock signals is typically not required. However, the transmission line over which the DDC data and clock signals are transmitted is typically not terminated in an impedance match, and tints reflections in the DDC cable may degrade the DDC signal as the DDC cable length increases. Furthermore, the bandwidth of the DDC signal is limited by the amount of pull-up current injected into the DDC cable during a transition from a low voltage signal (e.g., logic 0) to a high voltage signal (e.g., logic 1).

Figure 13:
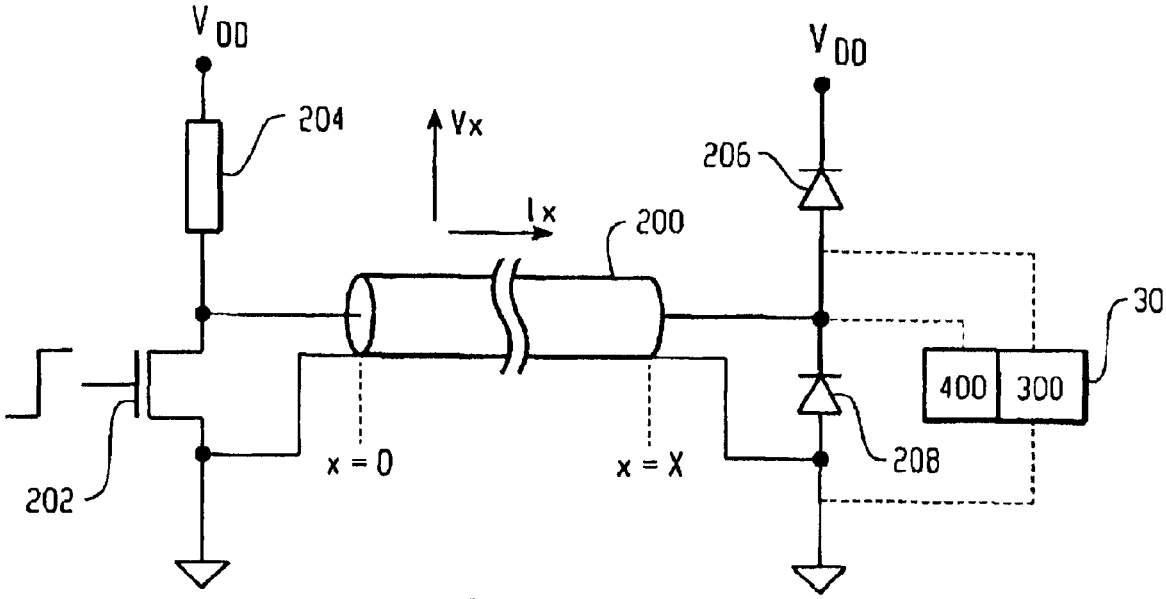
FIG. 13 is a block diagram of a DDC extender circuit connected to the receive end of the transmission line.

Accordingly, a DDC extender circuit 30 may be used to extend the DDC channel over a transmission line. FIG. 13 is a block diagram of the DDC extender circuit 30 connected to the receive end of a transmission line 200. The DDC channel typically transmits a voltage signal, as illustrated by a simple transistor driver 202 with a load transistor 204 interposed between the output terminal of the transistor 202 and a positive voltage $V_{DD}$.

On the receive end of the transmission line 200, a rail clamp circuit comprises a pair of diodes 206 and 208 connected to a ground potential and $V_{DD}$, respectively, with an output pin or receptacle corresponding to a conductor of the transmission line 200 interposed between the diodes.

The DDC extender circuit 30 comprises a voltage clamp circuit 300 and a current booster circuit 400. The voltage clamp circuit 300 is operable to provide voltage clamping during data transition from a positive voltage data signal to a zero voltage data signal, and the current booster circuit 400 is operable to provide a boost current during data transition from a zero voltage data signal to a positive voltage data signal.

Typically, the length of the transmission cable 200 causes inductive clamping at a receive end and also results in bandwidth limitations. A DDC link typically utilizes an Inter-1C (I2C) bus as the transmission line 200, which is a bi-directional two-wire serial bus that provides a communication link between integrated circuits (ICs). With respect to inductive clamping, the falling edge of the transmission line 200 voltage data signal is relatively short, because the element employed for asserting a logic 0 on the transmission line 200 is typically the transistor 202 having a low 'on' resistance.

As shown in FIG. 13, the receiving end of the transmission line 200 has a terminating impedance that is effectively an open-circuit, limited only by the rail clamping diodes 206 and 208. Additionally, the transmitting end of the transmission line 200 has a terminating impedance that is relatively small, and may be modeled as a short-circuit. Due to the lack of a matched termination at either the transmitting end or the receiving end of the transmission line 200, there are multiple reflections after the falling edge of the data signal is received at the receive end of the transmission line 200. These reflections can persist for several microseconds for transmission line lengths on the order of 50 meters.

Figure 14:
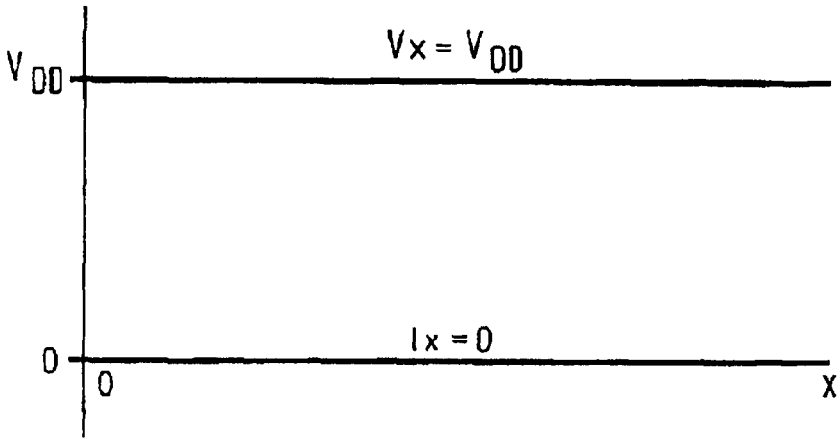
FIGS. 14–17 are timing diagrams illustrating the receive end response during a data signal transition.

FIGS. 14–17 are timing diagrams illustrating the receive end response during a data signal transition to the logic 0 level, e.g., from a positive voltage level to a zero voltage level. FIG. 14 illustrates the transmission line 200 voltage during steady state for a logic 1 data value. The transmission line 200 is charged to $V_{DD}$, and all energy in the transmission line 200 is stored in the line capacitance.

Figure 15:
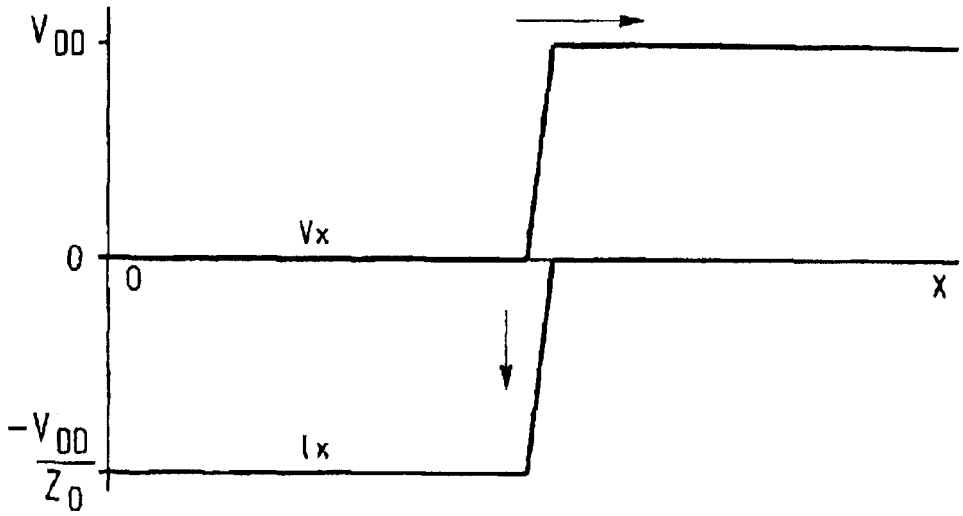

FIG. 15 illustrates a logic 0 data signal propagating from x=0 toward x=X along the transmission line 200. FIG. 15 assumes that the resistance of the transistor 202 is negligible in comparison to the characteristic impedance of the transmission line 200, which is typically around 100 ohms. Because the transmission line 200 voltage is essentially shorted to a logic 0 potential, e.g., a ground potential, the stored energy in the transmission line 200 capacitance must transfer to inductive energy as the data signal propagates through the transmission line 200, and thus the current pulse $I_x$ is induced. The magnitude of the current pulse is approximately $-V_{DD}/Z_o$.

Figure 16:
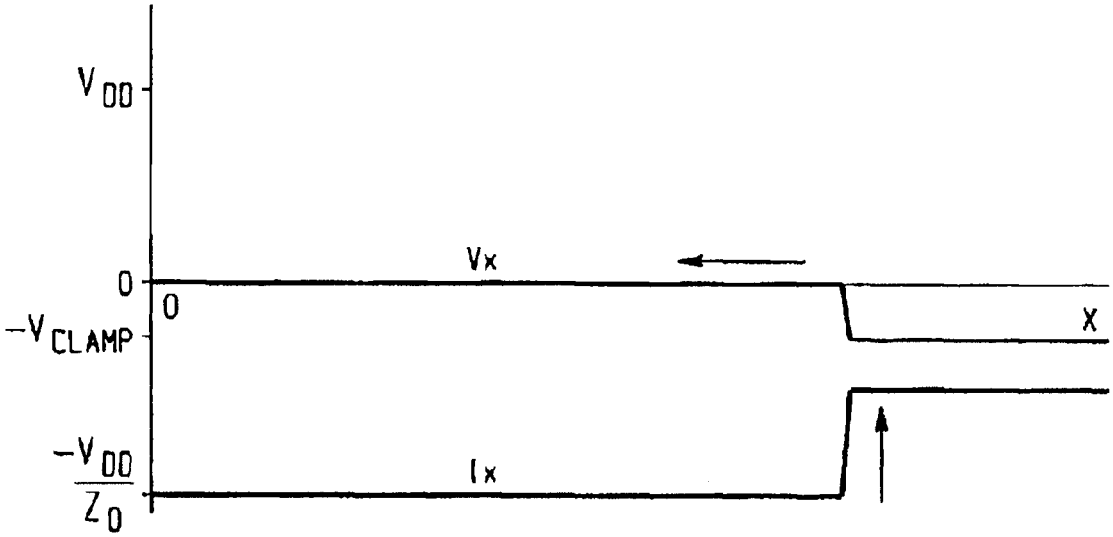
Figure 17:
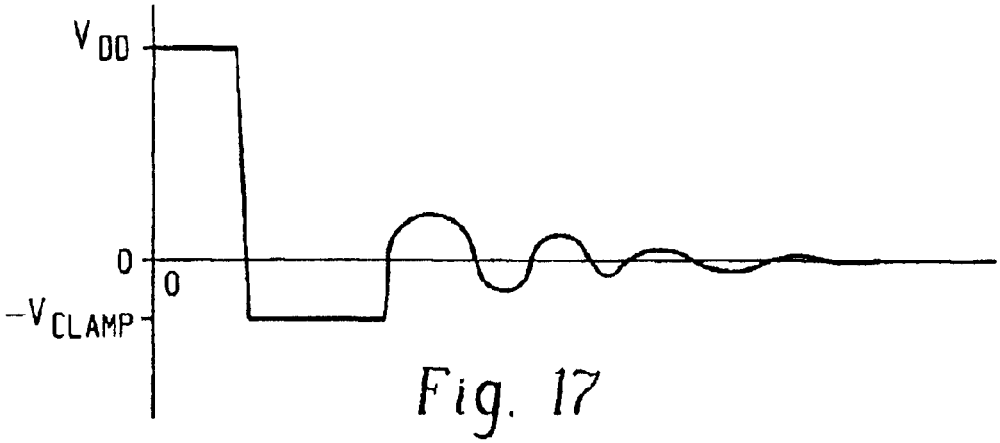

FIG. 16 illustrates the effect of a voltage clamp on the line reflection current $I_x$ and transmission line 200 voltage characteristic. When the falling edge of the data signal arrives at the receive end of the transmission line 200 for the first time, the receive end voltage will swing negative, i.e., below a logic 0 level, and activate a clamping device (e.g. the voltage clamp circuit 300, or the diode 208 if the voltage clamp circuit 300 is not present).

If the receive end voltage falls below the logic 0 level, then the receive end will ring with multiple reflections. For example, without a voltage clamp, the voltage at x=X would ring to a value of $-V_{DD}$, and $I_x$ would drop to zero as the energy in the line is forced to switch from inductive energy back to capacitive energy. This behavior is analogous to an LC 'tank' circuit. The voltage and current in the transmission line 200 would continue to ring at diminishing amplitudes as the energy in the line is dissipated by resistive losses of the transmission line 200.

A clamping device, such as the diode 208, may be used to limit the negative voltage swing to a value of $-V_{CLAMP}$, which attenuates the magnitude of the ringing at the receive end of the transmission line 200. Nevertheless, the ringing around the logic 0 level may compromise the noise margin of the DDC link. Furthermore, if the ringing persists through the period of the data signal, then the ringing may impair the detection of a transition from a logic 0 level to logic 1 level. Additionally, the conduction of current in the clamping device, such as diode 208, may cause significant injection of minority carriers into the substrate of the receiver chip, which in turn may cause a malfunction of the receiver operation. Typical negative clamp currents are 50 milliamps for 5V signal, and 30 milliamps for 3.3V signal.

When the receive end voltage is clamped to the logic 0 level, however, the resulting reflections are of negligible amplitude. Accordingly, a voltage clamp circuit 300 may be connected in parallel with the clamping diode 208 at the receive end of the transmission line 200. While the diode 208 is designed to conduct when a received falling edge of the data signal falls below the logic 0 level, the voltage clamp circuit 300 may absorb the negative pulse and prevent conduction of the diode 208.

Figure 18:
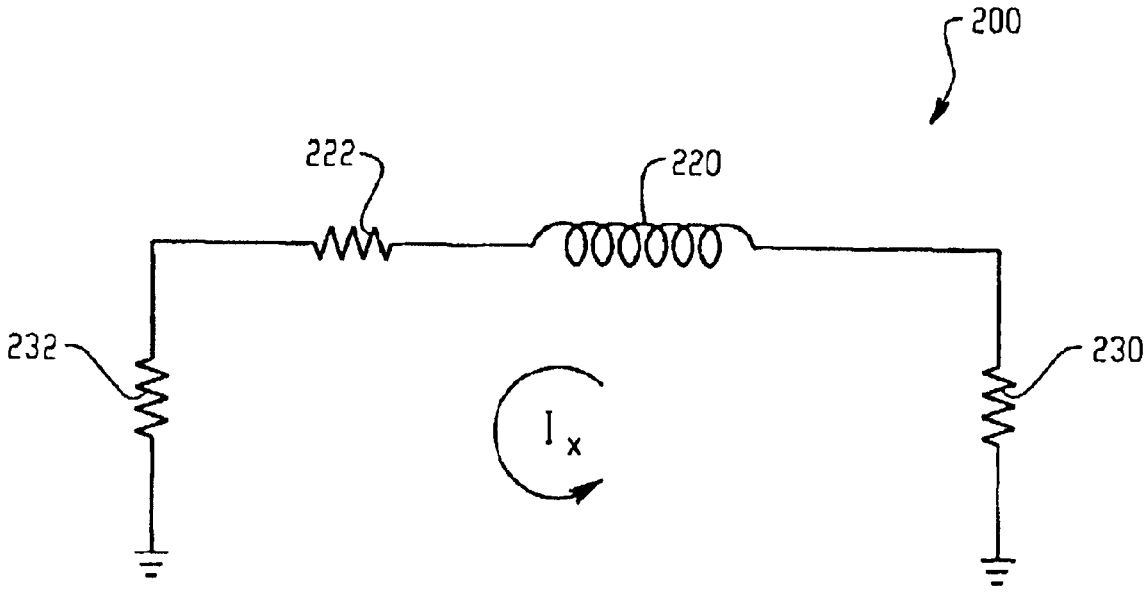
FIG. 18 is a schematic representation of the transmission line after activation of a voltage clamp circuit.

FIG. 18 is a schematic representation of the transmission line after activation of the voltage clamp circuit 300. The voltage clamp circuit 300 clamps the receive end of the transmission line 200 to a logic 0 level (e.g., 0 volts, a ground potential, etc.). Because the transmit end of the transmission line 200 is also at the logic 0 level, the transmission line 200 capacitance is essentially eliminated. The transmission line 200 may then be modeled in terms of its line inductance 220, as depicted in FIG. 18. In addition to the line inductance 220, the transmission line 200 also has a line resistance 222. The receiver input resistance 230 and the transistor 202 output resistance 232 are also included, as the transmission line 200 is loaded by these resistances at both ends.

Figure 19:
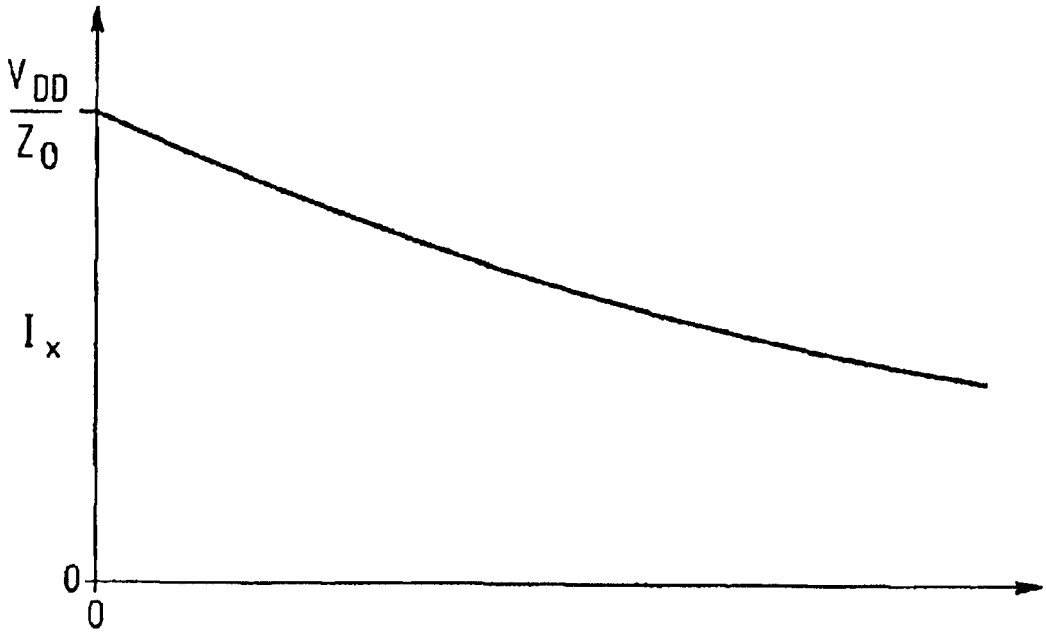
FIG. 19 is a timing diagram of the current in the transmission line after activation of the voltage clamp circuit.

FIG. 19 is a timing diagram of the current in the transmission line after activation of the voltage clamp circuit 300. The transmission line 200 current $I_x$ decays exponentially based on a time constant $\pi$=L/R, where L is the line inductance 220 and R is the sum of the resistances 222, 230, and 232. The voltage clamp circuit 300, by clamping the receive end of the transmission line 200 to a ground potential, causes the duration of the current flowing in the transmission line 200 to increase as compared to the duration of the transmission line 200 current $I_x$ when the transmission line is clamped to a negative value. The voltage at the receive end of the transmission line, however, remains at a logic 0 value. Accordingly, voltage oscillations in the receive end of the transmission line 200 are eliminated.

While the voltage clamp circuit 300 facilitates a data transition from a logic 1 to a logic 0 value on the transmission line 200, it does not primarily facilitate the rise time of a data transition from a logic 0 to a logic 1 value. The I2C architecture utilized by the DDC link uses either a passive pull-up resistor or fixed current source to assert a logic '1' on the transmission line 200, and thus only a finite amount of current is available to charge the transmission line 200 capacitance. Accordingly, there is an implicit bandwidth limitation imposed by the transmission line 200 capacitance that is proportional to a product of the pull-up resistance R and the line capacitance C.

A pull-up resistor in the range of 1.5K–2.2K may be used, which will typically limit a DDC link operating at a clock speed of 100 kHz to about 10 meters. A transmission line 200 in excess of this length will a cause decrease in the rise time for the rising edge of the voltage data signal. Increasing the length of the transmission line 200 increases the line capacitance, which will eventually result in the slew-rate of the 0–1 data transition to be too small to allow the rising edge of the data signal to cross a logic level detection threshold in the receiver within a specified time period.

Figure 20:
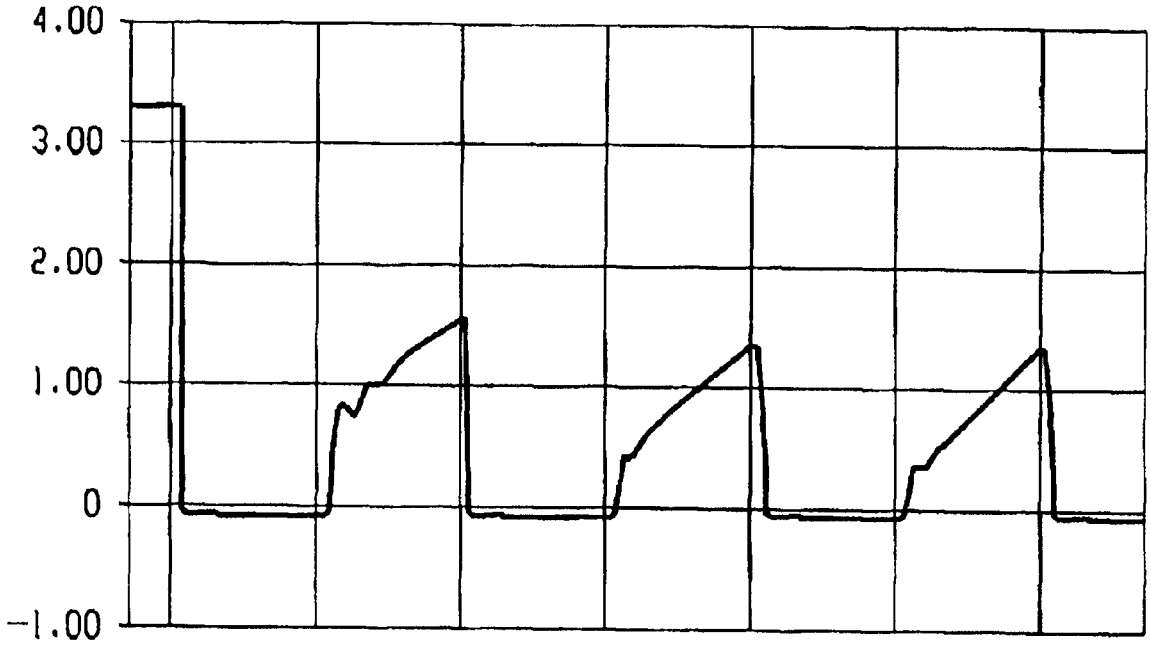
FIG. 20 is a timing diagram of the DDC data signal received at the receive end of the transmission line without a boost current injected into the transmission line.

FIG. 20 is a timing diagram of the DDC data signal received at the receive end of the transmission line 200 and with a voltage clamp circuit 300 connected to the receive end of the transmission line 200. The timing diagram corresponds to a 100 kHz clock signal transmitted over 50 meters of transmission line having an inductance of 1 uH/m, a capacitance of 90 pF/m, and a resistance of 125 mOhms/m. The voltage clamp 300 prevents oscillations of the receive end voltage during a transition from a logic 1 to a logic 0 value.

The RC ramp results in a trapezoidal appearance of the attenuated logic '1' pulses following an initial voltage step during a positive transition from logic 0 to logic 1. The initial voltage step preceding the RC ramp is caused by the inductive energy trapped in the line by the action of the voltage clamp 300 being released as the transistor 202 turns off to provide a logic 1 value to the transmission line 200. Because the voltage clamp 300 stores inductive energy in the transmission line 200, the voltage clamp 300 provides a secondary utility of slightly increasing the rise time of a positive data transition. However, the inductive energy stored in the transmission line is typically not enough to fully pull the data signal to a logic 1 level, as shown in FIG. 20.

While the value of the resistor 204 may be reduced to increase the pull-up current at the transmitting end of the transmission line 200, the additional pull-up current would require an increased power rating of the transistor 202 (or other suitable driving device). Accordingly, a current booster circuit 400 is connected to the receive end of the transmission line 200.

Figure 21:
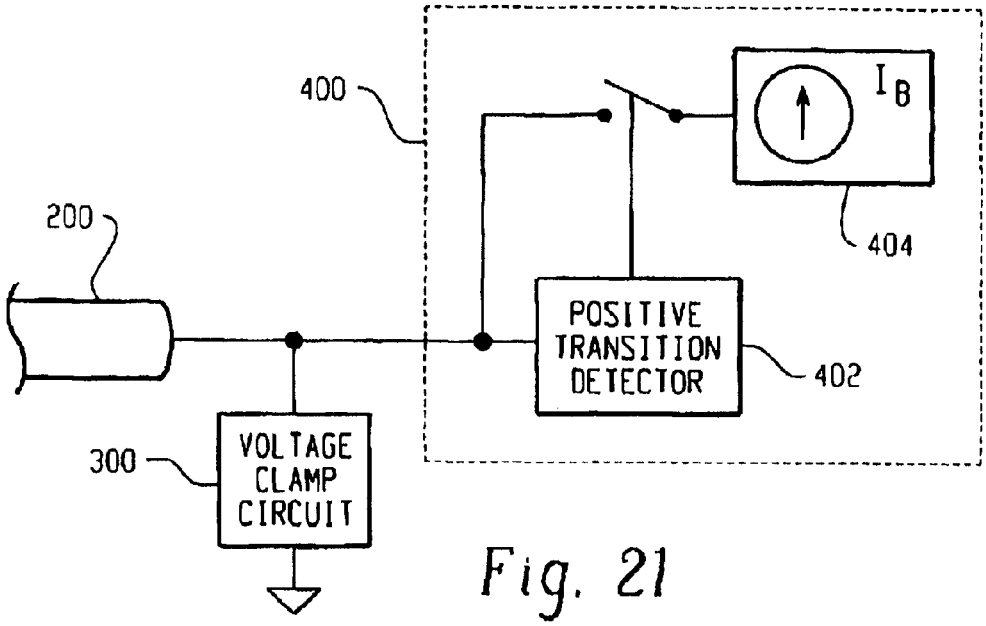
FIG. 21 is a block diagram of the DDC extender circuit of FIG. 14.

FIG. 21 is a block diagram of the DDC extender circuit 30 of FIG. 14. The current booster circuit 400 is operable to inject a boost current at the receive end of the transmission line 200 during a positive transition of the data signal. The current booster circuit 400 illustratively comprises a positive transition detector 402 and a switchable current source 404. The positive transition detector 402 is operable to determine the occurrence of a positive voltage transition from a logic 0 value to a logic 1 value, and to active the switchable current source 404 during the detection of such a positive transition. In one embodiment, the current booster circuit 400 provides the boost current to the receive end of the transmission line 200 when the data signal exceeds a first reference value and eliminates the boost current from the receive end of the transmission line 200 when the data signal exceeds a second reference value.

By providing additional pull-up current only for the duration of a positive data transition, open-collector signal devices on the transmission line 200 do not conduct at the same time as the boost current is being injected into the line, and thus the current booster circuit 400 is transparent to existing transmitting devices.

Furthermore, the current booster circuit 400 also provides a boost current at the receive end of the transmission line 200 when a digital signal is transmitted from the receive end. Accordingly, the current booster circuit 400 not only facilitates reception of digital signals at the receive end of the transmission line 200, it also facilitates the transmission of digital signals from the receive end of the transmission line 200. Thus, if the transmission line 200 is a bi-directional communication line, the current booster circuit 400 will provide a boost current at the receive end of the transmission line 200 when the voltage at the receive end transitions from a low state to a high state due to either reception of a digital signal from a transmitting device at the other end of the transmission line 200, or to the generation of a digital signal from a transmitting device connected to the receive end of the transmission line 200. Accordingly, bandwidth for both the transmission and reception of data may be increased.

Figure 22:
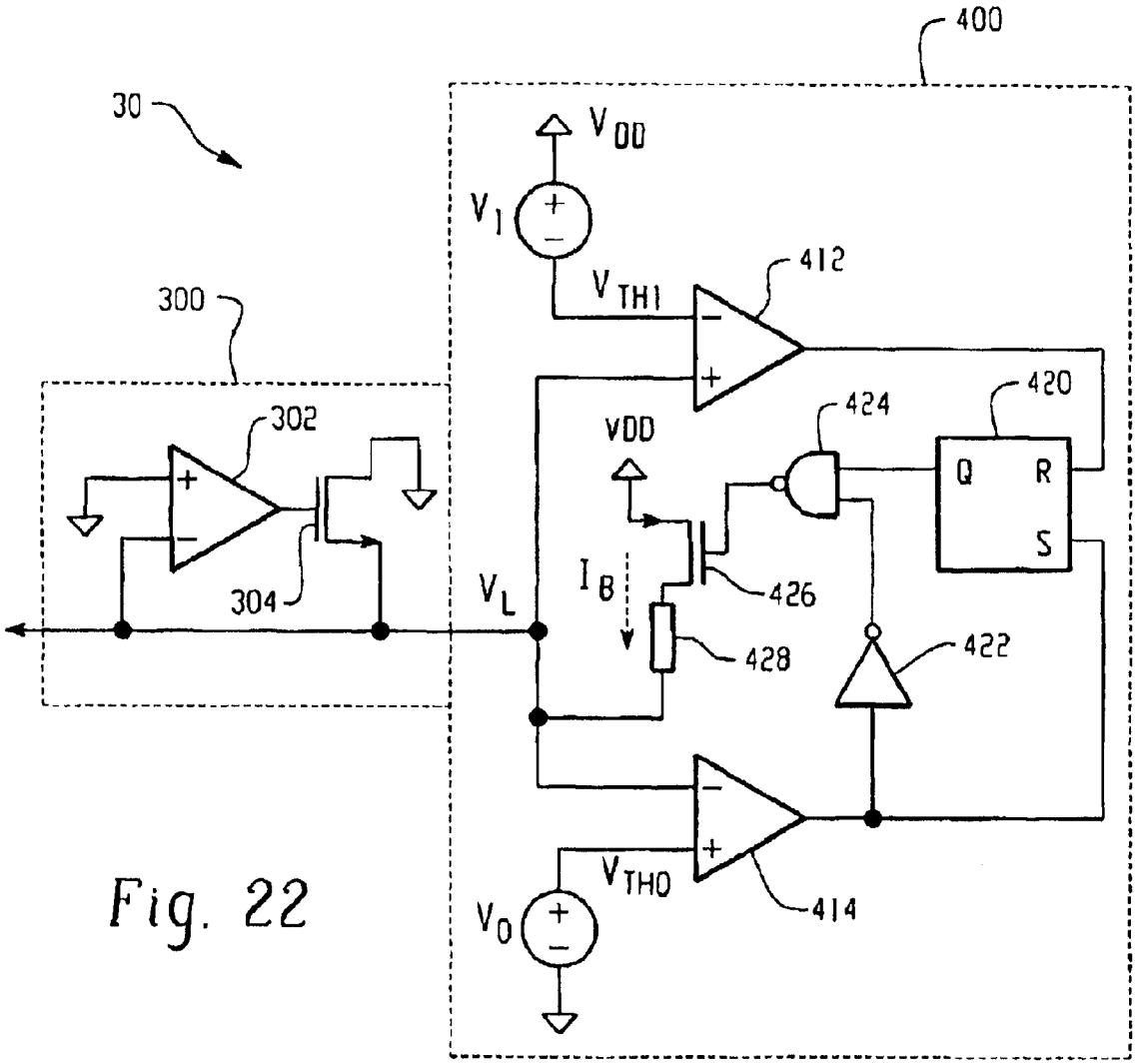
FIG. 22 is a schematic diagram one embodiment of the DDC extender circuit of FIG. 14.

FIG. 22 is a schematic diagram of one embodiment of the DDC extender circuit 30 of FIG. 14. The voltage clamp circuit 300 comprises a comparator 302 having a noninverting input connected to ground and an inverting input connected to the receive end of the transmission line 200. The comparator output is connected to the gate of a transistor 304, which in turn has a drain connected to ground and a source connected to the receive end of the transmission line 200.

During operation of the voltage clamp 300, when the voltage $V_L$ at the receive end of the transmission line 200 is greater than the ground potential, the comparator 302 outputs a low signal, which turns off the transistor 304, thus isolating the receive end of the transmission line 200 from ground. Conversely, when the voltage $V_L$ at the receive end of the transmission line 200 is less than or equal to the ground potential, the comparator 302 outputs a high signal, which turns on the transistor 304, thus coupling the receive end of the transmission line 200 to ground. Accordingly, the receive end of the transmission line 200 remains clamped to the ground potential until a positive voltage signal is applied to the transmission line 200.

While a field effect transistor 304 has been illustrated, other switching devices, such as a bipolar junction transistor, may also be used. Additionally, a positive offset voltage may also be interposed between the noninverting terminal of the comparator 302 and ground so that the receive end of the transmission line 200 is clamped to ground when the receive end of the transmission line 200 is within a noise margin, e.g., 1 mV, 10 mV, or some other noise margin.

The current booster circuit 400 comprises a first comparator 412 and a second comparator 414. The first comparator 412 has an inverting input terminal set at a potential of $V_{TH1}$, which is equal to $V_{DD}-V_L$. The noninverting input of the first comparator 412 is connected to the receive end of the transmission line 200. Accordingly, when the receive end voltage $V_L$ of the transmission line 200 is greater than $V_{TH1}$, the output of the comparator 412 is high, and when the receive end voltage $V_L$ of the transmission line 200 is less than $V_{TH1}$, the output of the comparator 412 is low.

Likewise, the second comparator 414 has a noninverting input terminal set at a potential of $V_{TH0}$, which is equal to a ground potential offset by a positive voltage $V_0$. The inverting input of the second comparator 414 is connected to the receive end of the transmission line 200. Accordingly, when the receive end voltage of the transmission line 200 is greater than $V_{TH0}$, the output of the comparator 414 is low, and when the receive end voltage $V_L$ of the transmission line 200 is less than $V_{TH0}$, the output of the comparator 414 is high.

Thus, the first and second reference values $V_{TH0}$ and $V_{TH1}$ define a low and high noise margin, respectively. Comparator 412 outputs a high signal when the receive end voltage $V_L$ of the transmission line 200 is above the high noise margin $V_{TH1}$, and comparator 414 outputs a high signal when the receive end voltage $V_L$ of the transmission line 200 is below the low noise margin $V_{TH0}$.

The output of the comparator 412 is connected as a reset input to a latch 420, and the output of the comparator 414 is connected as a set input to the latch 420, and also to an inverter 422. The output of the latch 420 and the output of the inverter 422 are provided as input to a NAND gate 424, which in turn is used to drive transistor 426. When the transistor 426 is on, a boost current $I_B$ is injected into the receive end of the transmission line 200. A resistor 428 coupled between the drain and the receive end of the transmission line 200 governs the magnitude of the boost current $I_B$. Alternatively, the resistor 428 could be replaced by a current mirror implementation of the transistor 426 drive circuitry. Other current source circuitry may also be used.

Operation of the current booster circuit 400 is described with reference to Table 2 below, which provides a state table corresponding to the receive end voltage $V_1$ of the transmission line 200 during a 1-0-1 logic transition.

TABLE 2

State Transition Table

| $V_L$ | S | R | Q | S' | (QS)' | $I_B$ |
|---|---|---|---|---|---|---|
| 1 | 0 | 1 | 0 | 1 | 1 | OFF |
| $V_{TH1^-}$ | 0 | 0 | 0 | 1 | 1 | OFF |
| $V_{TH0^-}$ | 1 | 0 | 1 | 0 | 1 | OFF |
| 0 | 1 | 0 | 1 | 0 | 1 | OFF |
| $V_{TH0^+}$ | 0 | 0 | 1 | 1 | 0 | ON |
| $V_{TH1^+}$ | 0 | 1 | 0 | 1 | 1 | OFF |
| 1 | 0 | 1 | 0 | 1 | 1 | OFF |

When the receive end line voltage $V_L$ is high, e.g. at a logic 1 level or $V_{DD}$, the output of the NAND gate 424 is high, and thus the transistor 426 is off, which prevents injection of the boost current $I_D$. As the receive end line voltage $V_L$ falls below the upper threshold $V_{TH1}$, the output of the comparator 412 goes low, and the reset input to the latch 420 likewise goes low. Consequently, there is no state change in the latch 420 output, and the transistor 426 remains off.

As the receive end line voltage $V_1$ falls below the lower threshold value $V_{TH0}$, the latch 420 is set. However, the output of the inverter 422 switches from a high state to a low state, and thus the output of the NAND gate 424 remains high. Accordingly, the transistor 426 remains off.

No state change is induced until the receive end line voltage $V_L$ exceeds the lower threshold $V_{TH0}$ during a positive voltage transition. At this time, the output of the comparator 414 goes low, which hi turn causes the output of the inverter 422 to go high. Accordingly, both inputs to the NAND gate 424 are high, which in turn causes the output of the NAND gate 424 to go low. The transistor 426 is thereby turned on, and the boost current $I_B$ is injected into the receive end of the transmission line 200.

The transistor 426 remains hi an on state until the receive end line voltage $V_L$ exceeds the upper threshold voltage $V_{TH1}$, which causes the latch 420 to reset. Accordingly, the output of the latch 420 goes low, which in turn causes the output of the NAND gate 424 to go high, shutting off the transistor 426 and eliminating the boost current $I_B$. The current booster circuit 400 is then in the original state, and the process of injecting a boost current $I_B$ is then repeated during the next 1-0-1 logic transition.

The threshold $V_{TH0}$ is typically set high enough so that noise immunity is not compromised, but not so high that significant duty-cycle distortion results from the delay of the turn-on boost current $I_B$. The low impedance of the signal device driving the '0' state on the transmission line 200, together with the inductive energy stored by the voltage clamp circuit 300 may be considered when selecting $V_{TH0}$.

As illustrated in Table 2, the comparators 412 and 414 form a level detector operable to output a plurality of 2-bit data signals corresponding to the voltage level $V_1$ at the receive end of the transmission line 200 with respect to the lower threshold value $V_{TH0}$ and the upper threshold voltage $V_{TH1}$. The data signals are input into the Set and Reset inputs of the latch 420 and the inverter 422 to generate the NAND gate 424 input signals, the output of which drives the transistor 426.

Figure 23:
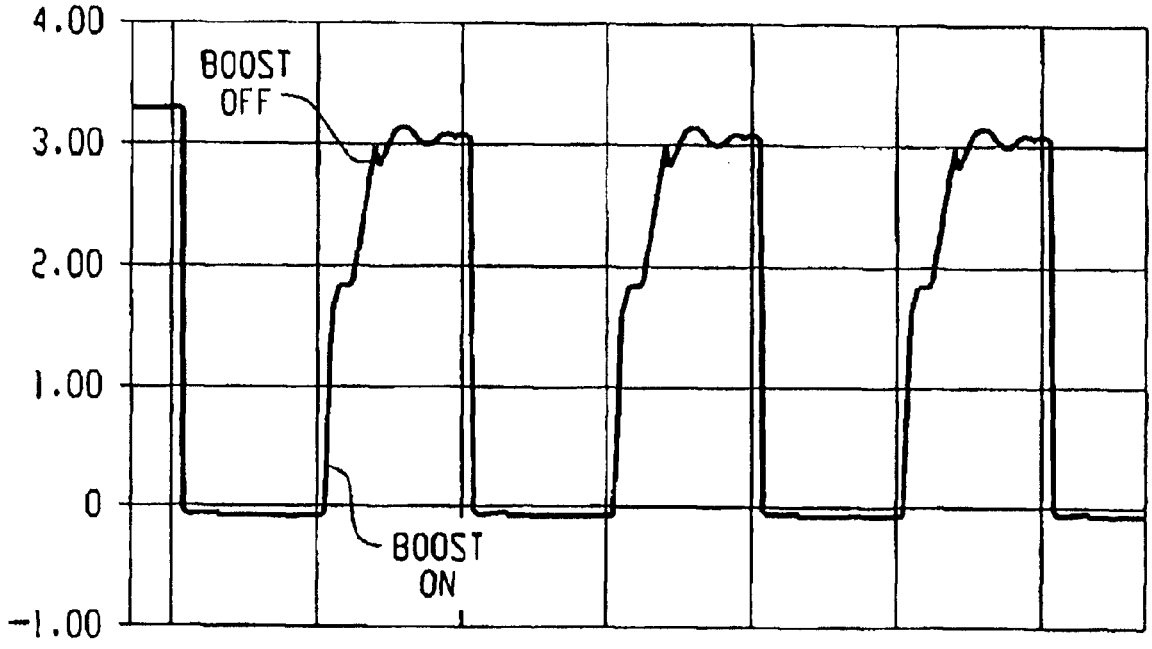
FIG. 23 is a timing diagram of the DDC data signal received at the receive end of the transmission line with a boost current injected into the transmission line.

FIG. 23 is a timing diagram of the DDC data signal received at the receive end of the transmission line 200 with a boost current injected into the transmission line 200. In the example of FIG. 23, the resistor 428 is illustratively 150 ohms, and the pull-up resistor in the transmitting device (e.g., resistor 204 of FIG. 13) is illustratively 2.2 kohms. The rising edge of the data signal is nearly vertical after the boost current $I_B$ is injected, representing the added voltage pull-up of the boost current $I_B$ and stored inductive energy. After the stored inductive energy dissipates, the boost current $I_B$ still provides additional voltage pull-up until the data signal exceeds the upper noise margin threshold $V_{TH1}$, at which time the boost current $I_B$ is eliminated.

The systems and methods herein have been described with reference to an illustrative DVI-compliant system, but are not limited to the illustrative DVI-compliant system. For example, the equalizer core gain stages 74 may be used to equalize any DC-balanced differential signal. The DC-balanced signal may be a differential voltage signal, or may be a differential current signal that is converted to a corresponding differential voltage signal. Likewise, the voltage clamp circuit 300 and the current booster circuit 400 of the DDC extender circuit 30 may be used for receiving any type of digital data signals or digital clock signals, and are thus not limited to the illustrative DDC channel implementation.

Additionally, the equalizer core gain stages 74 and the DDC extender circuit 30 may be implemented on a single receiver chip, or, alternatively, may be implemented on different receiver chips. For example, if the equalizer core gain stages 74 are configured to operate at the same power supply voltage as that of the DDC extender circuit 30, both circuits may be provided on a single receiver chip. Alternatively, if the DDC extender circuit 30 and the equalizer core gain stages 74 are configured to operate at different power supply voltages, e.g., 5 V and 3.5 V, respectively, then the DDC extender circuit 30 and the equalizer core gain stages 74 may be located on different receiver chips.

This written description uses illustrative embodiments to disclose the invention, including the best mode, and also to enable a person of ordinary skill in the art to make and use the invention. Other embodiments are within the scope of the claims if they have elements that do not differ from the literal language of the claims, or have equivalent elements.

What is claimed is:

1. A digital communication system for processing [Digital Visual Interface (DVI)] *transition minimized differential signal* (*TMDS*) communication data signals and Display Data Channel (DDC) communication signals over a transmission line, the system comprising:

an open-loop equalizer circuit operable to receive [DVI] *TMDS* communication signals transmitted over the transmission line and output equalized [DVI] *TMDS* communication data signals, the open-loop equalizer circuit comprising:

a differential pair defining first and second inputs;

a reactive load coupled to the differential pair; and a pair of input follower circuits configured to receive the [DVI] *TMDS* communication data signals and feedback signals from the reactive load and generate corresponding first and second input signals for the first and second inputs of the differential pair;

the open-loop equalizer circuit providing *either proportional or disproportional equalization to the TMDS communication data signal, wherein proportional equalization provides* a frequency dependent gain that is at or about the inverse of a frequency dependent attenuation caused by the transmission line, [the DVI communication data signal being proportionately equalized,] and [if the open-loop equalizer] *wherein disproportionate equalization* provides a frequency dependent gain that is greater than the inverse of a frequency dependent attenuation caused by the transmission line[, then the DVI communication data signal being disproportionately equalized].

2. The system of claim 1, further comprising:

a compensation circuit operable to compensate for intermediate circuitry attenuation of the [DVI] *TMDS* communication data signals.

3. The system of claim 1, further comprising:

a DDC extension circuit operable to inject a boost current at a receive end of the transmission line during a positive transition in the DDC communication signals.

4. The system of claim 1, wherein the pair of input follower circuits are further configured to provide unity gain.

5. The system of claim 4, wherein the input follower circuits comprise:

a first operational amplifier configured to receive as input a first [DVI] *TMDS* communication data signal and to receive a first feedback signal from the reactive load and generate the first input signal applied to the first input; and a second operational amplifier configured to receive as input the second [DVI] *TMDS* communication data signal and to receive a second feedback signal from the reactive load and generate the second input signal applied to the second input.

6. The system of claim 4, wherein the differential pair comprises first and second field effect transistors.

7. The system of claim 4, wherein:

the source of the first field effect transistor is connected to an input node of the first operational amplifier to provide the first feedback signal; and the source of the second field effect transistor is connected to an input node of the second operational amplifier to provide the second feedback signal.

8. The system of claim 3, wherein the DDC extension circuit comprises:

a voltage clamp connected to the receive end of the transmission line and operable to clamp a reflection signal caused by the DDC communication signals received at the receive end of the transmission line; and a current booster circuit connected to the receive end of the transmission line and operable to provide the boost current at the receive end of the transmission line when the DDC communication signal exceeds a first reference value and to eliminate the boost current from the receive end of the transmission line when the DDC communication signal exceeds a second reference value.

9. The system of claim 8, wherein the voltage clamp comprises:

a first comparator configured to receive as input the DDC communication signal and a first reference potential and to output a switch signal; and a first switch configured to receive the switch signal and to couple the receive end of the transmission line to a second reference potential when the DDC communication signal is less than the first reference potential.

10. The system of claim 9, wherein the first and second reference potentials are a ground potential.

11. The system of claim 8, wherein the current booster circuit comprises:

a boost current circuit connected to the receive end of the transmission line, the boost current circuit operable to provide the boost current during an activated state; and a detector circuit operable to monitor the DDC communication signal on the receive end of the transmission line and to activate the boost current circuit when the DDC communication signal exceeds the first reference value and to deactivate the boost current circuit when the DDC communication signal exceeds the second reference value.

12. The system of claim 11, wherein the detector circuit comprises:

a level detector operable to output a first data signal when the DDC communication signal is less than the first reference value, and to output a second data signal when the DDC communication signal is greater than the first reference value and less than the second reference value, and to output a third data signal when the DDC communication signal is greater than the second reference value; and a latch circuit operable to receive the output data signals of the level detector and in response to selectively activate and deactivate the boost current circuit.

13. The system of claim 12, wherein:

the first reference value is a first reference voltage greater than a logic 0 voltage signal; and the second reference value is a second reference voltage greater than the first reference voltage.

14. The system of claim 11, wherein the detector circuit comprises:

a first comparator configured to receive as input the DDC communication signal and the first reference value and output a first comparator signal;

a second comparator configured to receive as input the DDC communication signal and the second reference value and output a second comparator signal; and a latch configured to receive as input the first and second comparator signals and output a latch signal.

15. The system of claim 3, wherein the DDC extension circuit comprises:

a current booster circuit connected to the receive end of the transmission line, the current booster circuit operable to inject a boost current at the receive end of the transmission line during a positive transition in the DDC communication signal, and to eliminate the boost current at the end of the positive transition in the DDC communication signal and prevent injection of the boost current at the receive end of the transmission line during a negative transition in the DDC communication signal.

16. The system of claim 15, wherein the current booster circuit is adapted to inject the boost current at the receive end of the transmission line when the DDC communication signal exceeds a first reference value and eliminate the boost current from the receive end of the transmission line when the DDC communication signal exceeds a second reference value, and to prevent injection of the boost current at the receive end of the transmission line when the DDC communication signal falls below the second and first reference values.

17. The system of claim 1, wherein the open-loop equalizer is connected to a transmit end of the transmission line.

18. The system of claim 1, wherein the open-loop equalizer is connected to the receive end of a transmission line.

19. The system of claim 1, wherein the transmission line is a bus line.

20. The system of claim 1, wherein the transmission line is a cable external to a computer device.

21. The system of claim 3, wherein the DDC extension circuit is coupled to a bi-directional communication line in the transmission line.

22. A method for transmitting and receiving [Digital Visual Interface (DVI)] *transition minimized differential signal* (*TMDS*) communication data signals and Display Data Channel (DDC) communication signals over a transmission line, comprising:

providing feedback loops at the inputs to a differential pair, the feedback loops independent of output signals generated by the differential pair;

providing as input to the feedback [ioop] *loop* the [DVI] *TMDS* communication data signals at the received end of the transmission line;

generating first and second differential input signals from the [DVI] *TMDS* communication data signals and the feedback loop;

monitoring the DDC communication signal at the receive end of the transmission line; and injecting a boost current at the receive end of the transmission line during a portion of the positive transition in the DDC communication signal;

wherein the step of monitoring the DDC communication signal at a receive end of the transmission line comprises:

generating an injection activation signal when the DDC communication signal exceeds a first reference value; and eliminating the injection activation signal when the DDC communication signal exceeds a second reference value;

wherein the presence of the injection activation signal causes injection of the boost current at the receive end of the transmission line

*wherein* the step of monitoring the DDC communication signal at a receive end of the transmission line further comprising:

generating a first output by a first comparator having a first input and a second input, the second input coupled to the receive end of the transmission line, the first output being high when the second input exceeds the first input and the first output being low when the second input does not exceed the first input;

generating a second output by a second comparator having a third input and a fourth input, the fourth input coupled to the receive end of the transmission line, the second output being high when the fourth input exceeds the third input, and the second output being low when the fourth input does not exceed the third input;

receiving the first output by a latch as a reset input and receiving the second output by the latch as a set input;

receiving the output of the latch by a nand gate and receiving the inverted second output by the nand gate; and injecting the boost current when the output of the nand gate is high.

23. The method of claim 22, wherein the step of providing feedback loops at the inputs to a differential pair comprise the step of providing unity gain feedback loops.

24. The method of claim 23, wherein the step of providing feedback loops at the inputs to a differential pair comprise the step of generating a feedback signal from a reactive load connected to the differential pair.

25. The method of claim 23, further comprising clamping a reflection signal caused by the DDC communication signal received at the receive end of the transmission line.

26. The method of claim 23, further comprising the step compensating the [DVI] *TMDS* communication data signals for signal attenuation caused by ESD protection circuitry.

27. A system for transmitting and receiving [Digital Visual Interface (DVI)] *transition minimized differential signal* (*TMDS*) communication data signals and Display Data Channel (DDC) communication signals over a transmission line, comprising:

means for providing feedback loops at the inputs to a differential pair, the feedback loops independent of output signals generated by the differential pair;

means for providing as input to the feedback loop the [DVI] *TMDS* communication data signals at the received end of the transmission line;

means for generating first and second differential input signals from the [DVI] *TMDS* communication data signals and the feedback loop;

means for monitoring the DDC communication signal at the receive end of the transmission line; and means for injecting a boost current at the receive end of the transmission line during a portion of the positive transition in the DDC communication signal wherein the means for monitoring the DDC communication signal at the receive end of the transmission line comprises:

means for generating an injection activation signal when the DDC communication signal exceeds a first reference value; and means for eliminating the injection activation signal when the DDC communication signal exceeds a second reference value;

wherein the presence of the injection activation signal causes injection of the boost current at the receive end of the transmission line, the open-loop equalizer circuit providing *either proportional or disproportional equalization to the TMDS communication data signal, wherein proportional equalization provides* a frequency dependent gain that is at or about the inverse of a frequency dependent attenuation caused by the transmission line[, the DVI communication data signal being proportionally equalized,] and [if the open-loop equalizer] *wherein disproportionate equalization* provides a frequency dependent gain that is greater than the inverse of a frequency dependent attenuation caused by the transmission line[, then the DVI communication data signal being proportionately equalized].

28. The system of claim 27, wherein the means for providing feedback loops at the inputs to a differential pair are adapted for providing unity gain feedback loops.

29. The system of claim 28, wherein the means for providing feedback loops at the inputs to a differential pair are adapted for generating a feedback signal from a reactive load connected to the differential pair.

30. The system of claim 27, further comprising means for clamping a reflection signal caused by the DDC communication signal received at the receive end of the transmission line.

31. The system of claim 27, further comprising means for compensating the [DVI] *TMDS* communication data signals for signal attenuation caused by the ESD protection circuitry before transmission over the transmission line.

*32. The system of claim 1, wherein the TMDS communication data signals are Digital Visual Interface (DVI) communication data signals.*

*33. The method of claim 22, wherein the TMDS communication data signals are Digital Visual Interface (DVI) communication data signals.*

* * * * *